(12) United States Patent
Bertoni et al.

(10) Patent No.: US 12,103,200 B1
(45) Date of Patent: Oct. 1, 2024

(54) ACOUSTIC CLEAVING APPARATUS AND METHODS OF ACOUSTIC CLEAVING

(71) Applicant: Crystal Sonic, Inc., Phoenix, AZ (US)

(72) Inventors: Mariana Bertoni, Phoenix, AZ (US); Pablo Guimerá Coll, Tempe, AZ (US); Arno Merkle, Phoenix, AZ (US); Jon Williams, San Francisco, CA (US)

(73) Assignee: Crystal Sonic, Inc., Phoenix, AZ (US)

( * ) Notice: Subject to any disclaimer, the term of this patent is extended or adjusted under 35 U.S.C. 154(b) by 0 days.

(21) Appl. No.: 18/609,235

(22) Filed: Mar. 19, 2024

Related U.S. Application Data

(63) Continuation of application No. 18/608,054, filed on Mar. 18, 2024.

(60) Provisional application No. 63/513,536, filed on Jul. 13, 2023.

(51) Int. Cl.
*B28D 5/04* (2006.01)
*B06B 1/06* (2006.01)
*H01L 21/67* (2006.01)
*H01L 21/687* (2006.01)

(52) U.S. Cl.
CPC ............... *B28D 5/047* (2013.01); *B06B 1/06* (2013.01); *H01L 21/67092* (2013.01); *H01L 21/67115* (2013.01); *H01L 21/68707* (2013.01)

(58) Field of Classification Search
CPC ............... Y10T 225/307; Y10T 225/30; Y10T 225/321; H01L 21/67092; H01L 21/67115; H01L 21/68707; H01L 21/687; B06B 1/06; B28D 5/047
See application file for complete search history.

(56) References Cited

U.S. PATENT DOCUMENTS

| | | | |
|---|---|---|---|
| 10,828,800 B2 | 10/2020 | Bertoni et al. | |
| 2019/0287801 A1* | 9/2019 | Yamamoto | H01L 21/67092 |
| 2022/0241900 A1* | 8/2022 | Kanezaki | B23K 26/38 |
| 2022/0355419 A1* | 11/2022 | Izumi | H01L 21/67132 |
| 2023/0207390 A1* | 6/2023 | Bautista, Jr. | B23K 37/0408 |
| | | | 438/113 |

* cited by examiner

*Primary Examiner* — Phong H Nguyen
(74) *Attorney, Agent, or Firm* — Aikin & Gallant, LLP

(57) ABSTRACT

An acoustic cleaving system are described for initiating and controlling crack propagation. In an embodiment, the system includes an acoustic generator that includes a piezoelectric device; a high-voltage power supply; and an acoustic cleaving circuit. The acoustic cleaving circuit includes a push-pull circuit coupled to the piezoelectric device and coupled to the high-voltage power supply, and a capacitor bank that includes one or more capacitors coupled in parallel to the push-pull circuit. In one embodiment, the push-pull circuit is for receiving at least one input signal and for producing an amplified output signal to drive the piezoelectric device.

12 Claims, 14 Drawing Sheets

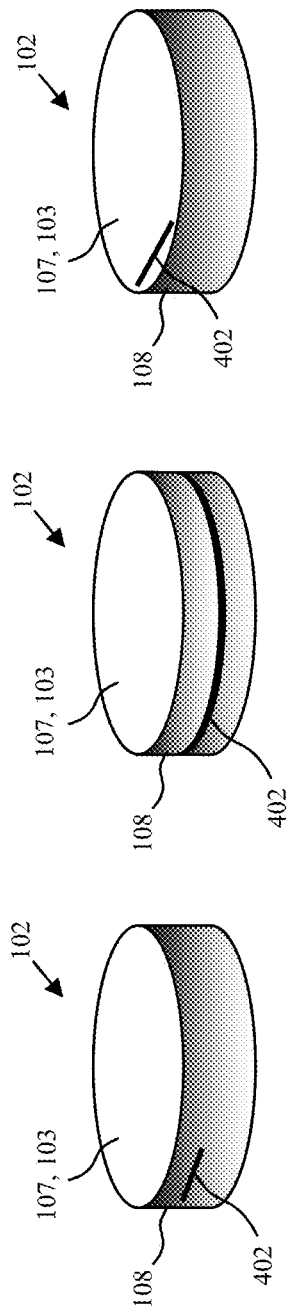
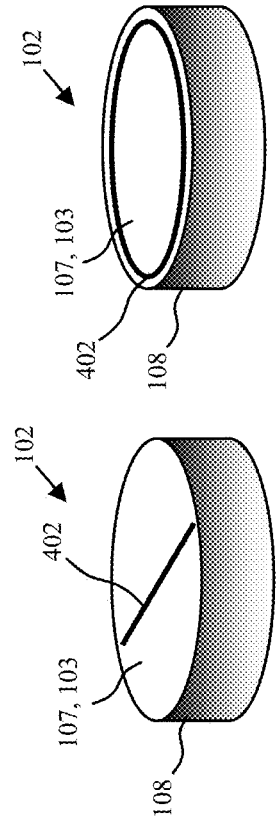

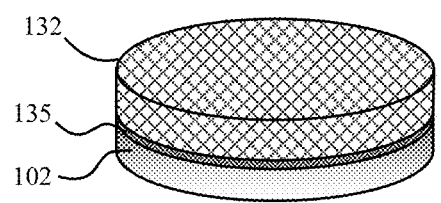
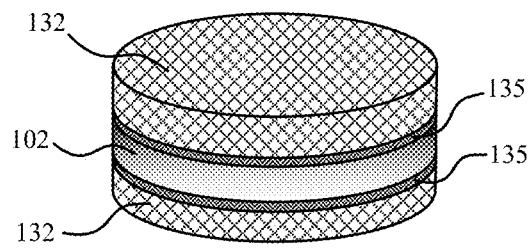
*FIG. 11A*  *FIG. 11B*
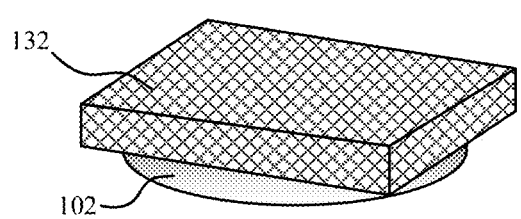
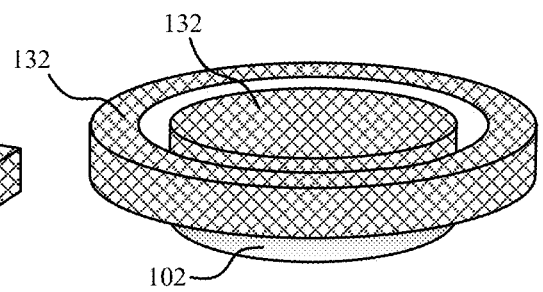
*FIG. 11C*  *FIG. 11D*
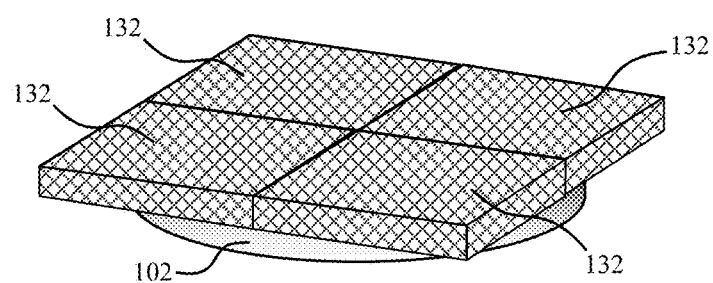
*FIG. 11E*

ACOUSTIC CLEAVING APPARATUS AND METHODS OF ACOUSTIC CLEAVING

RELATED APPLICATIONS

This application is a continuation of U.S. application Ser. No. 18/608,054, filed Mar. 18, 2024, which claims the benefit of priority of U.S. Provisional Application No. 63/513,536, filed Jul. 13, 2023, both of which are incorporated herein by reference.

BACKGROUND

Field

Embodiments described herein relate to semiconductor manufacturing and equipment, and more particularly to layer transfer.

Background Information

As the photovoltaics and various power electronics industries move towards non-silicon materials, there is a related drive for growth of semiconductor devices on the same or dissimilar substrates including silicon (Si), gallium arsenide (GaAs), indium phosphide (InP), gallium nitride (GaN), silicon carbide (SiC), aluminum nitride (AlN), diamond, etc. In traditional fabrication technique the substrate may be removed by backgrinding after formation of a semiconductor device layer. The substrates, however, represent a significant percent of overall device cost. In order to recoup some of these costs it has been proposed to re-claim the growth substrates for multiple uses. Removal techniques such as laser lift-off commonly include intermediate layers that can affect device layer growth quality. Other techniques such as spalling are commonly performed at high temperatures and may have significant variation in the cleaved surface conditions. More recently it has been proposed in U.S. Pat. No. 10,828,800 to utilize sound-assisted crack propagation for semiconductor wafering. In such an implementation is it proposed to form a premade crack in a substrate, apply a first stress to the material below a critical point of the material that is insufficient to initiate cracking, then to apply a controlled ultrasonic wave to the material causing the total stress applied at the crack tip in the material to exceed a critical point. The ultrasound wave can then be controlled to propagate cracking of the material.

SUMMARY

An acoustic cleaving apparatus, acoustic system, acoustic circuit, and methods of use are described with respect to cleaving a workpiece. In an embodiment, an acoustic cleaving apparatus includes a crack initiator system to create an indentation on a workpiece, a base stress system to induce a base stress on the workpiece, and an acoustic system to emit acoustic waves into the workpiece to maintain a controlled crack propagation through a material of the workpiece. As such, the acoustic cleaving apparatus can include an aggregate of systems to prepare and cleave a workpiece. A robotic arm may be included, for example, with a wand to hold the workpiece when being worked upon, or to transfer between systems. The robotic arm can additionally be coupled with a translation track.

In an embodiment the crack initiator system includes a laser, where the laser and workpiece are positionable relative to one another so that the laser can be directed toward a top surface or a back side (or side surface) of the workpiece.

In an embodiment, the acoustic cleaving apparatus additionally includes a substrate holder to support the workpiece. The acoustic system can additionally include an acoustic generator that includes an array of piezoelectric devices, an electronic system that includes an acoustic cleaving circuit connected to the array of piezoelectric devices to apply acoustic energy at different locations across the workpiece and at different times; and an acoustic enclosure including an annular opening to receive the workpiece.

In an embodiment the acoustic system includes an electronic system, an acoustic generator, and an acoustic enclosure. The acoustic generator in accordance with embodiments may include one or more piezoelectric devices, such as an array of piezoelectric devices. The acoustic cleaving apparatus may further include a substrate holder to support the workpiece, where the acoustic enclosure includes an annular opening to receive the workpiece. In some embodiments the acoustic enclosure is an acoustic absorber formed of a material selected from the group consisting of acoustic foam, vinyl sound barrier, damping compound, and acoustic putty. In some embodiments the acoustic enclosure is diffuser formed of a material characterized by an acoustic impedance within 100 MRayl of an acoustic impedance of the workpiece in order to transmit rather than reflect the waves. In some embodiments the acoustic enclosure includes an inner surface forming the annular opening and an outer surface, where the inner surface or the outer surface has a surface roughness, irregularities, or an irregular array of cavities characterized by an average surface roughness (Ra) of 1 nm to 1 mm to scatter acoustic waves transferred from the workpiece. In some embodiments the acoustic enclosure includes a second acoustic generator to emit acoustic waves that destructively interact with acoustic waves transferred from the workpiece.

In one embodiment, the acoustic system includes: an acoustic generator that includes a piezoelectric device; a high-voltage power supply including a positive voltage rail and a negative voltage rail; and an acoustic cleaving circuit that includes: a push-pull circuit coupled to the positive voltage rail and the negative voltage rail, the push-pull circuit including an output terminal that is coupled to the piezoelectric device, wherein the piezoelectric device is coupled to the negative voltage rail, and a set of one or more capacitors coupled in parallel to the push-pull circuit, where the push-pull circuit is for receiving at least one input signal and for producing an amplified output signal at the output terminal to drive the piezoelectric device. In another embodiment, the acoustic cleaving circuit includes: a first terminal for coupling to the positive voltage rail of the high-voltage power supply; and a second terminal for coupling to the negative voltage rail of the high-voltage power supply and to the piezoelectric device of an acoustic generator, where the push-pull circuit that comprises a first switch coupled between the first terminal and the output terminal, and a second switch coupled between the second terminal and the output terminal, wherein the first and second switches are of a same type of switches; where the set of one or more capacitors is coupled to the first and second terminals.

In one embodiment, the acoustic system includes: a piezoelectric device; a power supply; a signal generator for producing an input signal comprising a frequency at a resonant frequency of the piezoelectric device; and an amplifier coupled to the power supply, the signal generator, and the piezoelectric device, where the amplifier is for producing an output signal by amplifying the input signal using power supplied by the power supply to drive the piezoelectric device. In some embodiments, the amplifier includes a push-pull circuit, where the acoustic system further includes a capacitor bank that includes one or more capacitors coupled in parallel to the push-pull circuit.

According to another embodiment of the disclosure, an acoustic system includes an acoustic generator that includes a piezoelectric device, a high-voltage power supply, and an acoustic cleaving circuit that includes: a push-pull circuit coupled to the piezoelectric device and coupled to the high-voltage power supply, and a capacitor bank that includes one or more capacitors coupled in parallel to the push-pull circuit. In one embodiment, the push-pull circuit is for receiving at least one input signal and for producing an amplified output signal to drive the piezoelectric device.

In one embodiment, the push-pull circuit comprises a pair of switches of a same type in a push-pull arrangement. In another embodiment, each of the switches is an insulated-gate bipolar transistor (IGBT) or a Gallium Nitride (GaN) field-effect transistor (FET). In some embodiments, the acoustic system may include a signal generator for generating an input signal at a frequency. The acoustic cleaving circuit may include a first driving circuit coupled between the signal generator and a first switch of the pair of switches, the first driving circuit for producing a first driving signal based on the input signal and a second driving circuit coupled between the signal generator and a second switch of the pair of switches, the second driving circuit for producing a second driving signal based on the input signal, wherein the second driving signal is an inverted version of the first driving signal. In some embodiments, the acoustic cleaving circuit may include a first inverting Schmitt trigger that is coupled between the signal generator and the first driving circuit and a second inverting Schmitt trigger, wherein the first and second inverting Schmitt triggers are coupled between the signal generator and the second driving circuit.

In one embodiment, the high-voltage power supply has a maximum voltage between 3 kV and 20 kV. In another embodiment, each capacitor of the set of one or more capacitors has a capacitance within a range of 5 nF and 500 mF. In some embodiments, the acoustic system further includes a housing that includes the high-voltage power supply and the acoustic cleaving circuit.

In one embodiment, the piezoelectric device is a first piezoelectric device, the push-pull circuit is a first push-pull circuit, the capacitor bank is a first capacitor bank, the acoustic generator includes a second piezoelectric device, and the acoustic cleaving circuit further includes: a second push-pull circuit coupled to the second piezoelectric device and coupled to the high-voltage power supply, and a second capacitor bank that includes one or more capacitors coupled in parallel to the second push-pull circuit. In some embodiments, the high-voltage power supply is configured to supply a first output voltage with which the first push-pull circuit is to drive the first piezoelectric device and supply a second output voltage, which is different than the first output voltage, with which the second push-pull circuit is to drive the second piezoelectric device. In another embodiment, the first capacitor bank includes a first capacitance based on the first output voltage and the second capacitor bank includes a second capacitance, which is different than the first capacitance, and based on the second output voltage. In some embodiments, the acoustic system further includes at least one signal generator for driving at least one of the first and second push-pull circuits to provide output power from the high-voltage power supply to its respective piezoelectric device. In another embodiment, the at least one signal generator drives both the first and second push-pull circuits during at least partial overlapping time periods. In accordance with another embodiment, the at least one signal generator drives the first push-pull circuit during a first time period and drives the second push-pull circuit during a second time period that does not overlap the first time period.

In one embodiment, the piezoelectric device is a first piezoelectric device, the push-pull circuit is a first push-pull circuit, the acoustic generator includes a second piezoelectric device, the first push-pull circuit comprises a first pair of switches coupled to the first piezoelectric device, and the acoustic cleaving circuit includes a second push-pull circuit that includes a second pair of switches coupled to the second piezoelectric device, the first and second pairs of switches share a common switch. In another embodiment, the amplified output signal is a first amplified output signal that is to be produced by the first push-pull circuit to drive the first piezoelectric device during a first time period, the second push-pull circuit is for receiving at least one input signal and for producing a second amplified output signal to drive the second piezoelectric device during a second time period, wherein the first and second time periods are non-overlapping time periods.

In one embodiment, the high-voltage power supply includes a first pair of voltage rails for supplying a first output voltage across the first push-pull circuit and a second pair of voltage rails for supplying a second output voltage across the second push-pull circuit. In some embodiments, each pair of voltage rails comprises a negative voltage rail, the common switch is coupled to each negative voltage rail of both pairs of voltage rails. In another embodiment, the acoustic system further includes a signal generator coupled to the first and second pair of switches and for generating 1) a first pair of input signals for driving the first pair of switches during a first period of time and 2) a second pair of input signals for driving the second pair of switches during a second period of time subsequent to the first period of time.

According to another embodiment of the disclosure, an acoustic cleaving circuit includes: a first terminal for coupling to a positive voltage rail of a high-voltage power supply; a second terminal for coupling to a negative voltage rail of the high-voltage power supply and to a piezoelectric device of an acoustic generator; a push-pull circuit that comprises an output terminal for coupling to the piezoelectric device of an acoustic generator, a first switch coupled between the first terminal and the output terminal, and a second switch coupled between the second terminal and the output terminal, wherein the first and second switches are of a same type of switches; and a capacitor bank that is coupled to the first and second terminals.

In one embodiment, the same type of switches includes insulated-gate bipolar transistors (IGBTs) or a Gallium Nitride (GaN) field-effect transistors (FETs). In another embodiment, the acoustic cleaving circuit further includes: a first driving circuit coupled to the first switch, wherein the first driving circuit is for generating a first driving signal to drive the first switch; and a second driving circuit coupled to the second switch, wherein the second driving circuit is for generating a second driving signal that is an inverted version of the first driving signal to drive the second switch.

In one embodiment, each of the first and second driving circuits includes an opto-isolator coupled in series between two inverting Schmitt triggers. In another embodiment, the acoustic cleaving circuit further includes: a first inverting Schmitt trigger coupled to the first driving circuit, the first inverting Schmitt trigger is for receiving an input signal and for providing an inverted version of the input signal to the first driving circuit; and a second inverting Schmitt trigger coupled between the first inverting Schmitt trigger and the second driving circuit, the second inverting Schmitt trigger for receiving the inverted version of the input signal and for providing a non-inverted version of the input signal to the second driving circuit. In some embodiments, each of the first and second driving circuits comprises an opto-isolator coupled between two inverting Schmitt triggers and a gate driver coupled to one Schmitt trigger in a same arrangement.

BRIEF DESCRIPTION OF THE DRAWINGS

FIGS. 6A-6E are schematic perspective view illustrations for indentations formed on workpiece in accordance with embodiments.

FIGS. 7A-7C are illustrations for indentation patterns in accordance with embodiments.

FIGS. 11A-11E are schematic perspective view illustrations of various arrangements of acoustic generators in accordance with embodiments.

DETAILED DESCRIPTION

Figure 1:
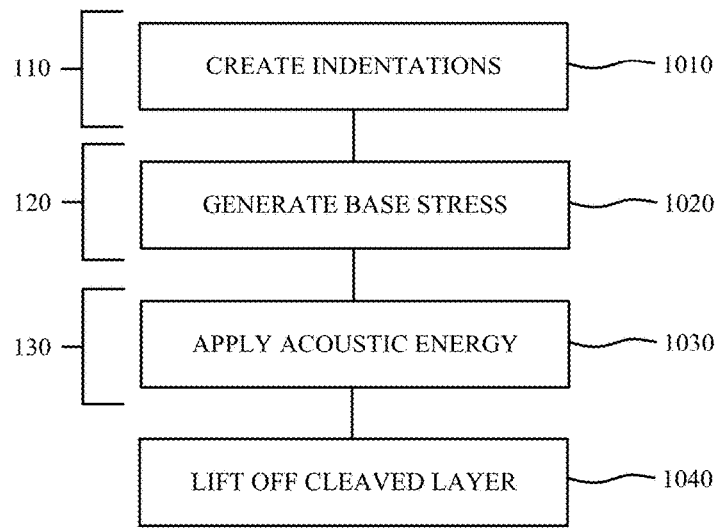
FIG. 1 is an illustration of a flow chart for a sequence of cleaving a workpiece in accordance with an embodiment.

Embodiments describe an acoustic cleaving apparatus and methods of use to cleave workpieces, such as semiconductor growth substrates with heterogeneously or homogenously grown device layers. In one embodiment, the acoustic cleaving apparatus in accordance with embodiments can include an aggregate of systems to prepare and cleave a workpiece. For example, the acoustic cleaving apparatus can include a crack initiator system to create an indentation to promote fracture, a base stress system to approach the critical stress to start crack propagation, and acoustic system for controlled crack propagation. The crack initiator system may create an indentation or pattern of indentations that function as a nucleation site for crack propagation, or alternatively as part of a stressor for crack initiation at an alternative location. The base stress system may be configured to induce an initial stress to the workpiece through thermal, mechanical, and/or an acoustic source such as with the acoustic system. The acoustic system may include further subsystems such as an electronic system to generate an electrical signal via an energy (voltage) source and energy output control, an acoustic generator that is activated by the electronic system to emit acoustic waves that increase stress in the workpiece, and an optional acoustic enclosure near one, some, or all sides of the workpiece to affect interaction of the acoustic waves and the workpiece.

Another aspect of the disclosure includes an acoustic system designed to drive one or more piezoelectric devices of an acoustic generator at comparatively higher or lower voltages than the operating voltage that may be used to operate at least a portion of the system. In particular, the system includes an acoustic cleaving circuit that has a power amplifier that may be configured to supply power from a high-voltage power supply to a piezoelectric device. For instance, the power amplifier may include a push-pull amplifier circuit that includes a pair of switches that are driven at a high frequency out of phase (e.g., by 180°) to alternate between supplying current from the high-voltage power supply to the piezoelectric device and drawing current from the device into the power supply. As a result, the power amplifier provides a high-voltage output signal as a series of high-voltage pulses to the piezoelectric device to cause the device to oscillate according to (or based on) the frequency at which the pair of switches are driven. As a result, the amplifier produces an output signal by amplifying an input signal using power supplied by the power supply to drive the piezoelectric device.

In addition, the acoustic cleaving circuit may include one or more capacitors, as a capacitor bank, which may be in parallel with the push-pull circuit. In particular, the capacitor bank may be coupled to the positive and negative rails of the high-voltage power supply to supply additional energy as the circuit alternates current from the power supply. As described herein, the push-pull circuit may be driven at a high frequency in order to oscillate the piezoelectric device. As current is drawn from the high-voltage power supply and then provided back into the supply from the piezoelectric device, the supplied voltage may sag. In particular, the system may have a significant amount of transient current due to the high-voltage swings caused by the push-pull circuit switching at high frequency. Also, the high-voltage supply may not have enough stored voltage to drive the piezoelectric device at full power (e.g., due to the current being supplied by the power supply lagging the applied voltage). As a result, the capacitor bank may be arranged to maintain a constant voltage across the piezoelectric device as the current alternates, and may provide an improved power factor.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1, a flow chart is provided for a sequence of cleaving a workpiece in accordance with an embodiment. At operation 1010 indentations can be created in the workpiece with the crack initiator system 110. The indentation(s) may create a crack or provide an irregularity in one or more surfaces of the workpiece to promote the fracture of the workpiece at the indentation(s) or at another location within the workpiece. For example, in some embodiments a pattern of indentations can be formed on the back side of a growth substrate, while crack propagation proceeds in an orthogonal direction across the workpiece between the growth substrate and device layer. The crack initiator can be mechanical, chemical, or use optical methods (such as laser) to create the indentation. In accordance with embodiments, the crack initiator system 110 can form a pattern of indentation(s), including line(s), dots, etc. which can be on one or more sides of the workpiece in order to create one or more locations of weak points for crack formation and propagation (either at the location of the indentations or another location). For example, the shape can be one or several continuous or discontinuous line(s) or dots in a straight line or non-linear pattern. The location of indentation(s) can be on one or all edges/sides of the workpiece at a determined height, on top of and/or bottom surface close to the edge, far from the edge, or at the center of the workpiece. The location could follow one, some or all edges/sides. The length of the pattern/shape of indentation (s) can be from 1 μm to the entire length or width of the workpiece while the depth can be from 1 μm to 500 μm and the tip radius can be from 10 nm to 500 μm, for example.

At operation 1020 a base stress is generated in the workpiece 102 with the base stress system 120. The base stress can reach a critical stress to start a crack propagation in the workpiece, or it can be below the value so that a crack propagation will not initiate.

In a thermal system, one or a plurality of stressors (e.g., stressor layers) such as metal, polymer, ceramic, semiconductor with different coefficient of thermal expansion (CTE) from the workpiece can be attached to one or both (bottom/top) sides of the workpiece (and device layer to be cleaved) forming a composite with a stressor applicator. In operation a change in temperature from room temperature in the growth substrate, device layer, and stressor system creates a load and a moment in the workpiece due to differences in CTE. This stress generated in the workpiece is the base stress. In an exemplary embodiment, the base stress is introduced to the workpiece via the stressor layer(s) by the substrate holder, which can be a cold plate, or alternatively a hot plate.

In a mechanical system the base stress can be introduced from any or a combination of any of a tensile, compression, bending, fatigue, and/or shear stress created directly by one or several mechanical apparatuses. In an acoustic system the base stress can be introduced by the acoustic system 130, or a part thereof, such as dedicated piezoelectric materials.

Acoustic energy can then be applied simultaneously and/or subsequently to the workpiece at operation 1030 with the acoustic system 130 in order to maintain a controlled crack propagation through the workpiece material. A cleaved device layer may then be lifted off the growth substrate (or vice versa) at operation 1040.

Figure 2:
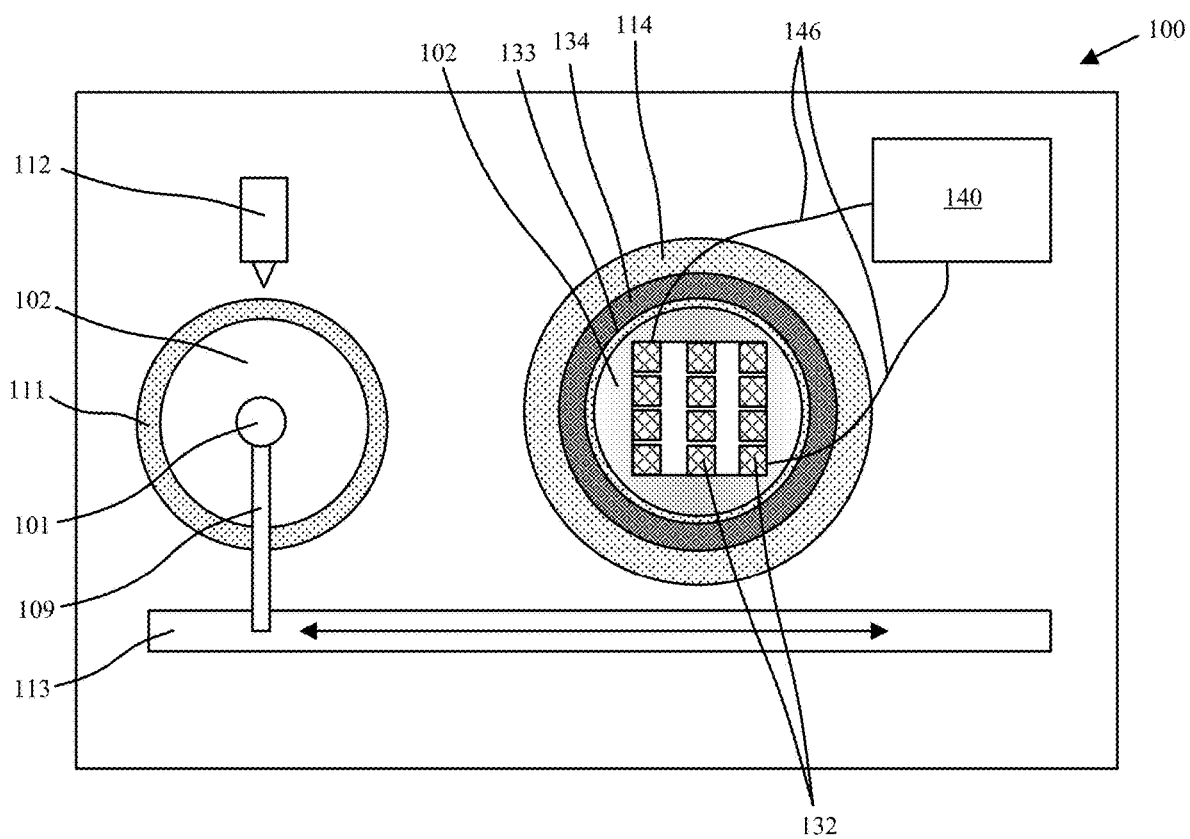
FIG. 2 is a schematic top view illustration of an acoustic cleaning apparatus in accordance with an embodiment.

FIG. 2 is a schematic top view illustration of an acoustic cleaving apparatus 100 in accordance with an embodiment. The cleaving apparatus 100 may include all systems and subsystems used to initiate crack propagation and lift-off a cleaved layer (e.g., device layer) from the workpiece. In accordance with embodiments, the various components of the acoustic cleaving apparatus form the crack initiator system 110, base stress system 120, and acoustic system 130. The crack initiator system 110 may include a mechanical, chemical or optical indenter which creates an indentation on the workpiece to promote the fracture of the workpiece on that indentation or another location. The base stress system 120 (which may be mechanical, thermal and/or acoustic/electrical) can be used to reach a critical stress to start a crack propagation, or a value below this stress where a crack propagation will not proceed. The acoustic system 130 may be configured to emit acoustic waves into the workpiece to maintain a controlled crack propagation through the materials of the workpiece. The acoustic system can include an electronic system, an acoustic generator, and an optional acoustic enclosure. The crack initiator system, base stress system and acoustic system may be located on the same or separate locations. The crack initiator system and base stress system may also be applied in an interchangeable order before the acoustic system.

In the particular embodiment illustrated in FIG. 2 the crack initiator system 110 includes a laser 112 that is positionable over, under, or laterally adjacent to a side surface of the workpiece 102. Workpiece 102 may be supported by the same or different substrate holder in the crack initiator system 110 as the base stress system 120 and acoustic system 130. For example, workpiece 102 may be supported by a substrate holder 111 in the crack initiator system 110, and then transferred to a substrate holder 114 for processing with the base stress system 120 and acoustic system 130. For example, wand 101, robotic arm 109, and translation track 113 may be used to move the workpiece 102 between systems. For example, wand 101 may be vacuum operated though other manners for holding the workpiece 102 are envisioned, including finger clamps, etc. In another embodiment the workpiece 102 need not be supported by a substrate holder 111 when processed by the crack initiatory system 110. For example, it may be sufficient to have the workpiece held by a wand 101 or mechanical gripper when processed by mechanical, chemical, or optical methods (e.g., laser 112) to form indentation(s).

In the particular embodiment illustrated in FIG. 2 the base stress system 120 is a thermal system where thermal stress is introduced to the workpiece 102 with the substrate holder(s) via an optional coupling agent (e.g., adhesive, gel, etc.). For example, the thermal stress can be applied with substrate holder 111 and/or substrate holder 114, which may be a cold plate (held below room temperature) or hot plate (held above room temperature).

Figure 3:
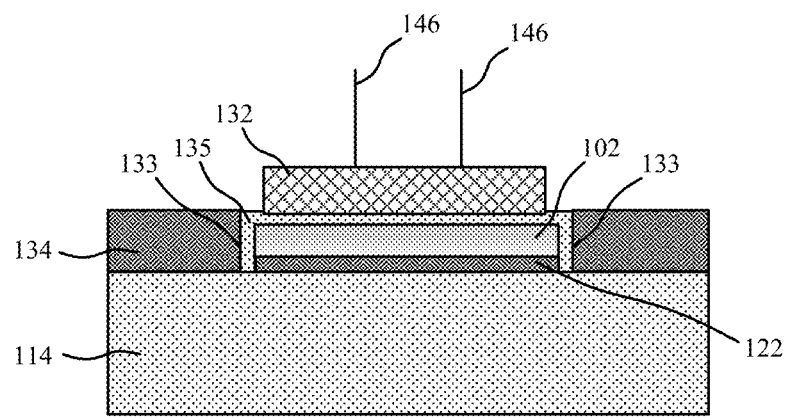
FIG. 3 is a schematic cross-sectional side view illustration of a workpiece secured in an acoustic system in accordance with an embodiment.

The workpiece 102 may be secured in both the base stress system 120 and acoustic system 130 together as shown in FIG. 3. A high-level system diagram of an acoustic system 130 in accordance with embodiments is shown in FIG. 4.

Figure 4:
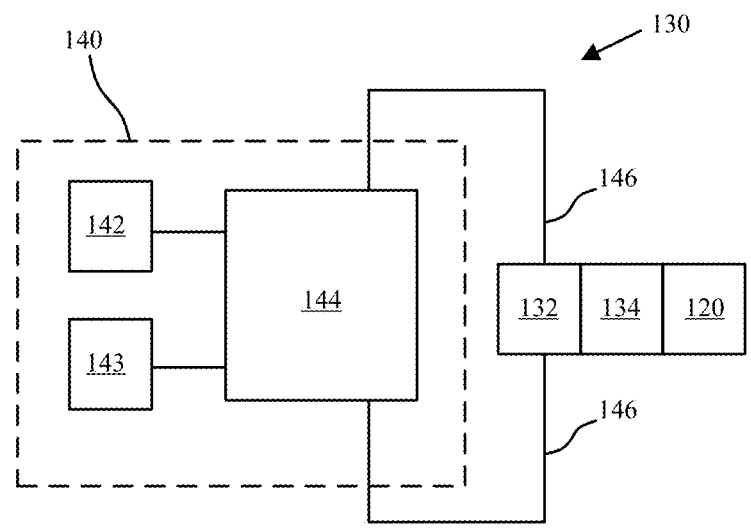
FIG. 4 is a system level diagram of an acoustic system in accordance with an embodiment.

Referring to each of FIGS. 2-4, the acoustic system 130 in accordance with embodiments may include a plurality of subsystems including an electronic system 140, an acoustic generator 132, and an optional acoustic enclosure 134. The acoustic generator 132 and/or acoustic enclosure 134 may each be in direct contact with the workpiece 102 or separated from and coupled to the workpiece with a coupling agent 135. In an embodiment, the acoustic enclosure 134 includes an (annular) opening 133 to receive the workpiece 102. The electronic system may generate an electrical signal via an energy source 142 (e.g., low-voltage power supply and high-voltage power supply), a signal generator 143 and an acoustic cleaving circuit 144 to control energy output to activate the acoustic generator 132 (e.g., piezoelectric material). As will become apparent in the following description the acoustic system and acoustic generators can be utilized across various systems. For example, the acoustic generator(s) 132 (e.g., piezoelectric material) can be used for crack propagation with the acoustic system 130 as well as for base stress generation in the base stress system 120.

The electronic system 140 can be any combination of an energy storage component (including but not limited to batteries, capacitor, and supercapacitors), switches, voltage sources, amplifiers, relays, pulsers, etc. The electronic system can have other circuit components designed to reduce or increase the inductance, voltage overshoots, current overshoots, ringing and flyback voltage of the system including opto-oscillators, Schmitt triggers, etc.

The electrical signal generated by the electronic system 140 in accordance with embodiments can be a combination of pulses with a voltage amplitude between 0 kV and 20 kV, or >20 kV. The width of each pulse can be varied between 10 ns and 10 s while the time t between each pulse can range from 20 ns and 1 s. The total amount of pulses "n" can be 1, 2 or more than 2. Each electrical pulse can have the same or different characteristics and can be sent to the same or different acoustic generators, or more particularly to piezoelectric materials. The signal can also be one or several chirps where the shape of the signal can be square, rectangular, triangular, saw toothed, sinusoidal, ramp or any combination of shapes. The voltage amplitude can be between 0 kV and 20 kV, or higher (>20 kV). The frequency of the signal frequency can be defined from 1 Hz to 100 MHz and the amount of repetitions "n" can be 1, 2 or more than 2. The electronic system 140 can be connected to the acoustic generator(s) 132 with leads 146, e.g., wires.

Each acoustic generator 132 in accordance with embodiments emits "acoustic waves" to increase the stress in the workpiece 102 and device layer to be cleaved from the workpiece 102. Each acoustic generator 132 can be located on one, some or every side of the workpiece. The type of acoustic waves generated can be planar or focused. The resonant frequency of the acoustic generator 132 may be between 1 kHz and 100 MHZ. The acoustic generator(s) can be constructed by one or several layers of piezoelectric material. The assembly of several acoustic generators can form different patterns including but not limited to circular, square, or rectangular.

The acoustic generator(s) 132 can be in direct contact with the workpiece 102 (or device layer thereof) or separated and coupled through a coupling agent 135 (as shown in FIG. 3). The separation with the workpiece can be up to 50 mm and controlled with a robotic arm, spacers, or any other means. The coupling agent 135 can be located only between the workpiece 102 and the acoustic generator 132, or the entire system can be submerged in the coupling agent. In an embodiment, the acoustic generators 132 are utilized as part of the base stress system 120. Thus, acoustic generators 132, including separate groups thereof, can be used for crack propagation and/or base stress.

The acoustic system 130 may additionally include an acoustic enclosure 134 which can be located adjacent to, or surround, one, some or all sides of the workpiece. The acoustic enclosure 134 may affect (through reflection, absorption, etc.) acoustic waves emitted by the propagating crack during the fracture.

Figure 5:
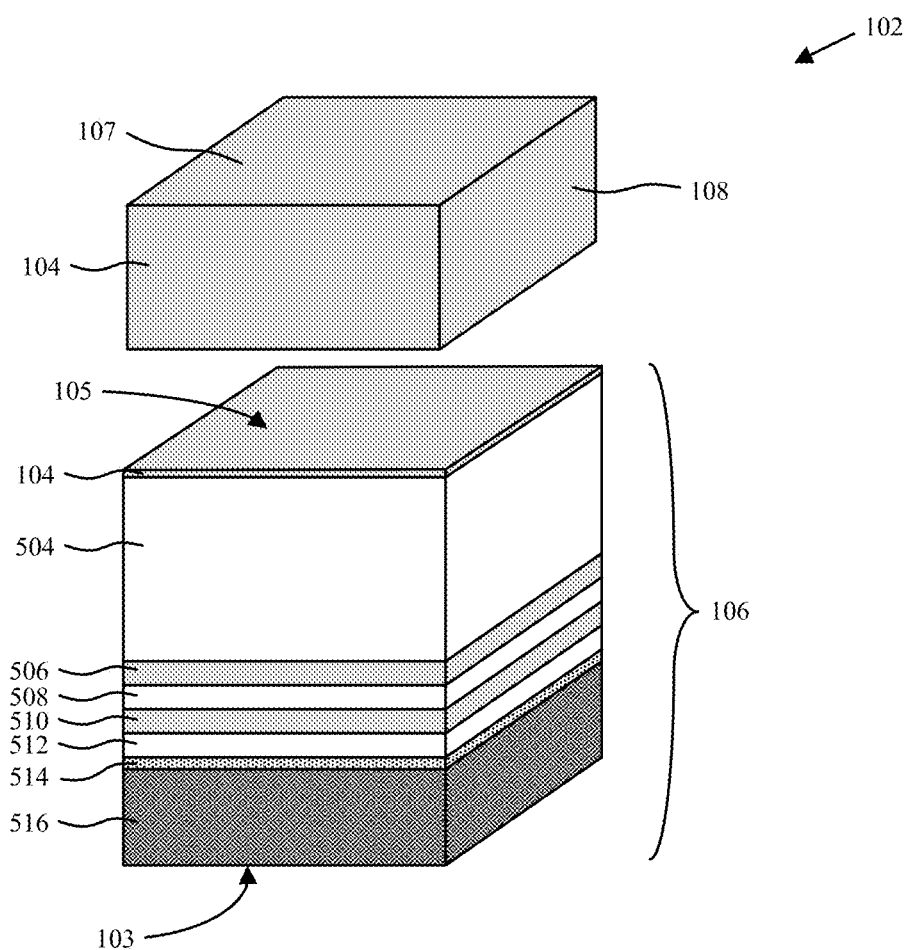
FIG. 5 is a schematic perspective view illustration of a workpiece including a device layer to be lifted off a growth substrate in accordance with an embodiment.

Referring now to FIG. 5, a schematic perspective view illustration is provided of a workpiece 102 including a device layer 106 to be lifted off in accordance with an embodiment. As shown, the workpiece 102 being worked upon in accordance with embodiments may include a growth substrate 104, followed by a buffer layer 504 to absorb stress and defects from lattice mismatch, followed by a various additional functional layers 506, 508, 510, 512 (e.g., charge transport layers, active layers, blocking layers, confinement layers, etc.) depending upon the device to be formed, current spreading layer 514, and electrode layer 516. The device layer may be utilized for a variety of electronic and optoelectronic functions, and may be based on III-V and/or II-VI semiconductor structures, for example. By way of exemplary illustration only, in one exemplary application of the growth substrate 104 may be GaAs, with a GaInP buffer layer, followed by device layers 506, 508, 510, 512 formed of material such as, but not limited to, GaAs, InAlP and GaInP, a GaAlAs current spreading layer 514 and metal (e.g., Au) electrode layer 516. It is to be appreciated that such a stack-up is provided for illustrational purposes only for cleaving of a device layer 106 from growth substrate 104, and embodiments are not limited to such an exemplary stack-up. As shown, cleaved surface 105 may occur at a location at, or just below the buffer layer 504 or within the buffer layer 504 so that the growth substrate 104 can be reclaimed and re-used multiple times for subsequent growth of device layers 106. In accordance with embodiments various indentation(s) can be formed on front/back sides and side surfaces of the workpiece. In particular, the indentations can be formed on a back side 107 of the growth substrate 104, and side 108 surface of the growth substrate 104 though embodiments are not so limited and indentations can also be formed on the device layer 106, such as top surface 103 (e.g., of the electrode layer 516). In yet other embodiments, the indentation(s) can be formed on the growth surface of the growth substrate 104 prior to forming the device layer 106.

Referring now to FIGS. 6A-6E schematic perspective view illustrations are provided for indentations 402 formed on a workpiece 102 in accordance with embodiments. For example, the indentation 402 patterns can be formed by laser 112, though embodiments are not so limited. As shown in FIG. 6A, the indentation 402 can be along side 108 surface of the workpiece 102, and more particularly of the growth substrate 104. The indentation 402 can be along one side 108 or several sides 108. As shown in FIG. 6B, the indentation 402 can be along all sides 108, for example, a continuous pattern around the workpiece 102, or growth substrate 104. In the embodiment illustrated in FIG. 6C, the indentation 402 is formed along a back side 107 of the growth substrate 104, or top surface 103 of the device layer 106. More particularly, the indentation 402 can be formed near an edge, or side 108. The indentation 402 may also be centered as shown in FIG. 6D, or around all edges/sides 108 on the back side 107 or top surface 103 as shown in FIG. 6E. A variety of options are available. The indentations 402 in accordance with embodiment can be singular, or patterns. For example, as shown in FIG. 7A the indentations may be continuous, for example, linear or other continuous patterns. As shown in FIG. 7B the indentations can be non-continuous, or dashed, in a linear or non-linear pattern. As shown in FIG. 7C the indentations can be a pattern of dots in a linear or non-linear pattern. A variety of configurations, and combination of shapes and patterns can be used to control crack formation and propagation.

In a particular configuration, a pattern of dashes or dotted indentations 402 is formed along the back side 107 and/or side 108 of the growth substrate 104. It has been observed that indentations along the back side 107 can increase stress by as much as 20% in the growth substrate 104 near regrowth interface with the device layer 106. Upon application of the base stressor (e.g., heat/cold) the additional stress generated across the heterogenous or homogeneous system of the growth substrate 104 and device layer 106 can be at or above a critical stress sufficient to lift off the device layer 106.

Figure 8A:
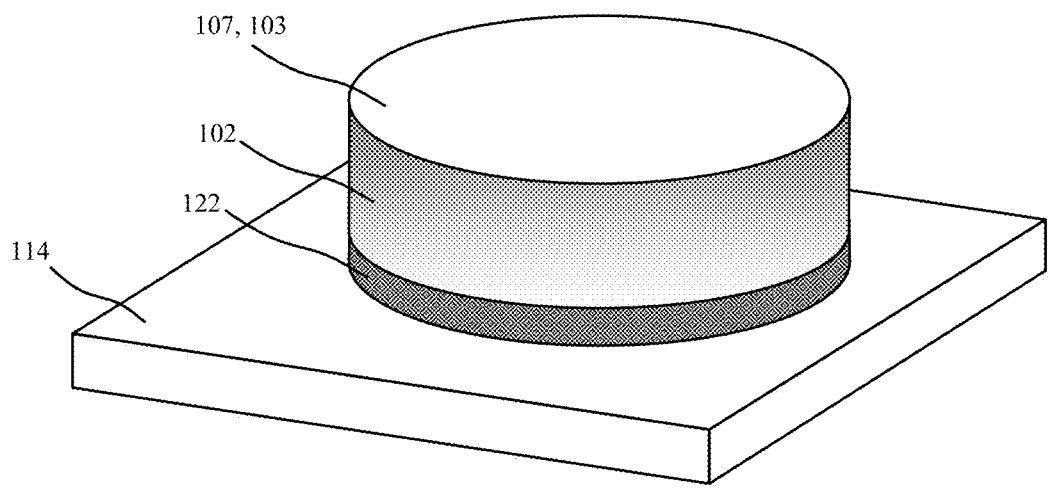
FIGS. 8A-8B are schematic perspective view illustrations for base stressor layers in accordance with embodiments.
Figure 8B:
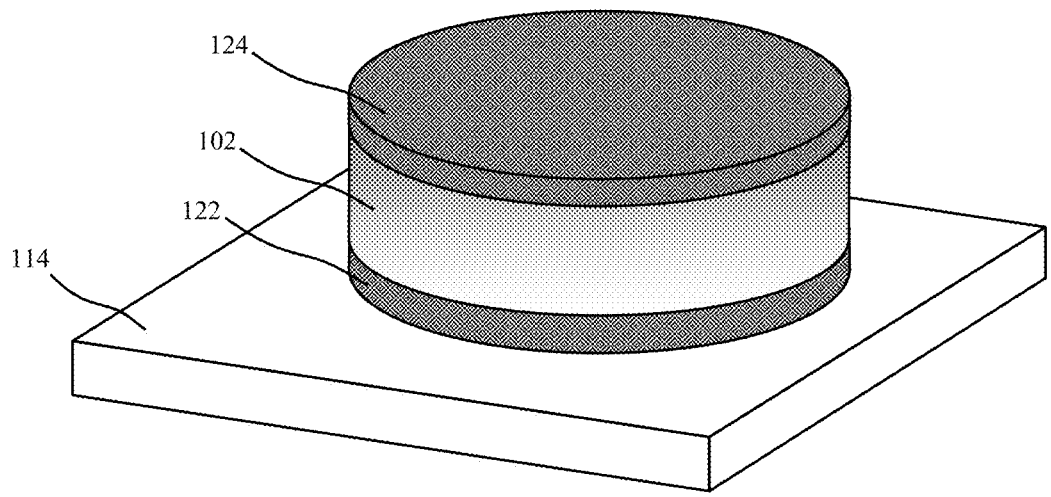

Referring now to FIGS. 8A-8B various configurations are provided in which the base stressor system includes a base stressor layer used to transfer thermal energy to the workpiece 102. In the particular embodiment illustrated in FIG. 8A the base stressor system includes the substrate holder 114, which may be a hot/cold plate, and a lower base stressor layer 122 on a bottom side of the workpiece 102. For example, the lower base stressor layer 122 may be a polymer adhesive (e.g., epoxy, acrylic, etc.) that is deposited onto the workpiece then when cooled down it contracts more than the workpiece 102. For example, the base stressor layer material may be a thermoset. Mismatch in coefficient in thermal expansion (CTE) then causes the base stress. As shown in FIG. 8B an upper base stressor layer 124 can also, or alternatively, be provided on the top side of the workpiece 102, though this is not required. Materials other than polymer may also be used. In use, the base stressor layers can be sacrificial layers that also act as a handle for lift-off of the device layer. While illustrated as single layers, it is to be appreciated that the base stressor layers 122 and 124 can each include a single layer of material, or multiple layers of the same or different materials. A variety of configurations are possible. The base stressor layer(s) can then be removed. Particular orientation of the workpiece 102 may depend upon the particular circumstances, and thus, the topmost surface shown in FIG. 8A may be back side 107 of the growth substrate 104 or alternatively top surface 103 of the device layer 106.

Figure 9:
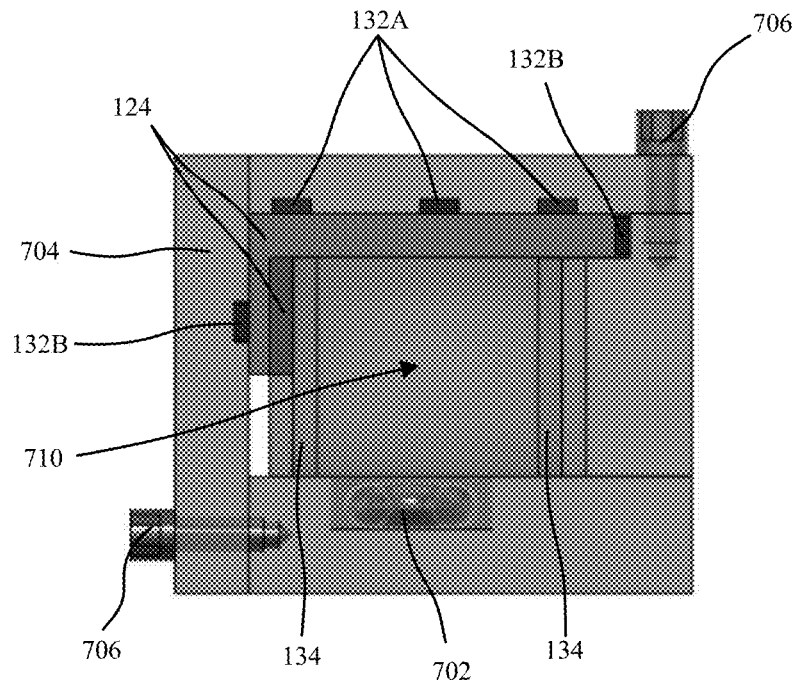
FIG. 9 is a schematic cross-sectional side view illustration of a base stress system in accordance with embodiments.
Figure 10:
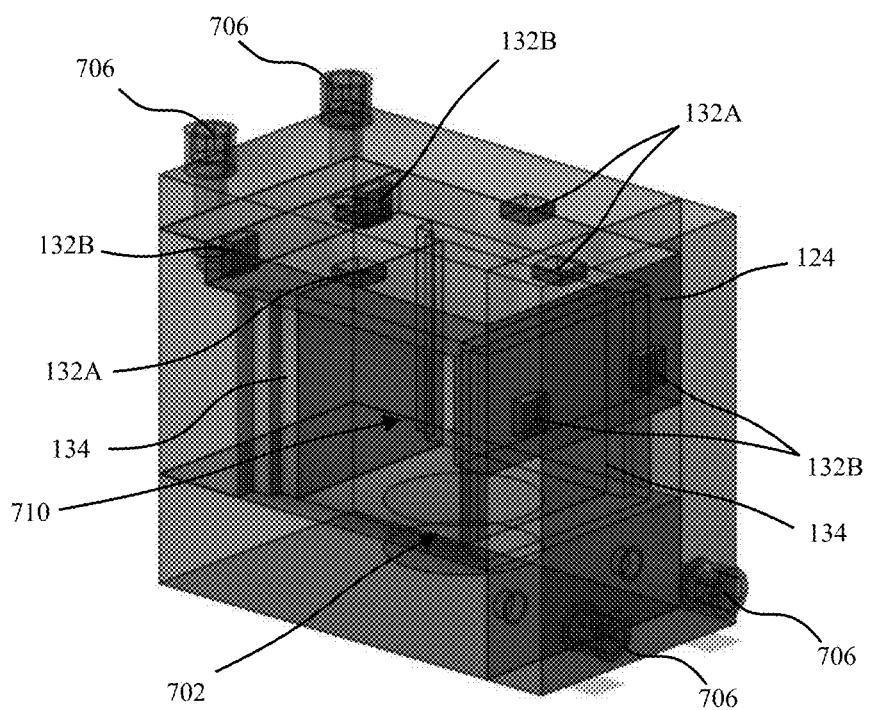
FIG. 10 is a schematic perspective view illustration of a base stress system in accordance with embodiments.

In alternative configurations the base stress system 120 may include mechanical and/or electrical stressors. Referring now to FIGS. 9-10, FIG. 9 is a schematic cross-sectional side view illustration of a base stress system in accordance with embodiments; FIG. 10 is a schematic perspective view illustration of a base stress system in accordance with embodiments. In each of the embodiments illustrated in FIGS. 9-10 mechanical stress may be provided by a pneumatic positioning unit 702 where mechanical stress on the workpiece 102 can be controlled by pressure in the pneumatic positioning unit 702. Various components of the system can be maintained in precise location with an alignment feature 704 (e.g., frame, plate, etc.) and fasteners 706 (e.g., screws, micrometers, etc.). In the particular embodiment illustrated acoustic generators can be used for both base stress generation in the base stress system 120, and crack propagation within the acoustic system 130. Specifically, the acoustic generators 132A (e.g., piezoelectric material) can be used for base stress generation, such as tensile stress on the workpiece 102, and acoustic generators 132B (e.g., piezoelectric material) can be used for crack propagation, such as shear stress on the workpiece 102 that can be secured within cavity 710. In the illustrated embodiments, the acoustic generators 132A, 132B may be mounted onto one or more base stressor layers 124. An acoustic enclosure 134 may also be secured within the system. In such a configuration, the opening 133 of the acoustic enclosure 134 (see FIG. 3) may define the cavity 710.

The acoustic generators 132, whether used for base stress generation or crack propagation, can include a variety of shapes and arrangements adjacent the workpiece (e.g., in direct contact or separated and coupled to the workpiece), and may be located on one, some or every side of the workpiece 102 in accordance with embodiments.

FIGS. 11A-11E are schematic perspective view illustrations of various arrangements of acoustic generators in accordance with embodiments. In the embodiment illustrated in FIG. 11A an acoustic generator may assume a similar shape (e.g., circular) and similar size as the workpiece 102. The acoustic generator 132 may be located on the back side 107 or top surface 103 of the workpiece 102 in accordance with embodiments, or on both sides as shown in FIG. 11B. The acoustic generator(s) 132 may also have dissimilar shape, such as rectangular or square, compared to the workpiece 102 as shown in FIG. 11C. The acoustic generator(s) 132 can also be patterned as shown in FIG. 11D. For example, a specific pattern may assist crack propagation direction. In the particular embodiment illustrated the acoustic generator(s) pattern includes a concentric ring surrounding a disc, though this is merely exemplary. If separate pieces, the acoustic generators 132 can be connected to different acoustic sources. For example, such a concentric pattern may be implemented where the crack starts in the center of the workpiece. Referring to FIG. 11E multiple acoustic generators 132 can be distributed across the workpiece 102, and may be connected to different voltage sources, or differently connected to the same voltage source, in order to apply acoustic energy at different locations, and/or different times to control crack propagation. In accordance with embodiments, a plurality or array of acoustic generators 132 can be used with timing difference, where the acoustic generators are triggered at different time and/or different voltages. In the particular embodiment illustrated in FIG. 11E a 2×2 array is illustrated though the array can be larger, such as 4×4, 8×8, etc. Such arrangements may be used to control crack propagation across the workpiece 102, from one side to an opposite side, in accordance with an embodiment.

In an embodiment, the one or more acoustic generators 132 (or arrays thereof) may optionally be held by a robotic arm 109 with actuator, for example, lowered down over workpiece 102 and in contact with the workpiece either directly, or with an optional coupling agent 135 such as a backing (e.g., adhesive layer) or ultrasonic gel applied to the workpiece 102 and/or acoustic generators 132. The acoustic system 130 in accordance with embodiment can additionally include an optional acoustic enclosure 134 that can be located adjacent to, or surround one, some, or all sides of the workpiece 102. The acoustic enclosure 134 may affect (through reflection, absorption, scattering, acoustic emission, etc.) acoustic waves emitted by the propagating crack during fracture.

Figure 12A:
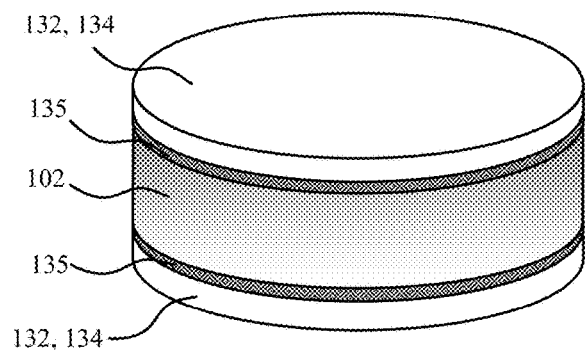
FIGS. 12A-12D are schematic perspective view illustrations of an optional coupling agent utilized to couple one or more acoustic generators or acoustic enclosures to a workpiece in accordance with embodiments.
Figure 12B:
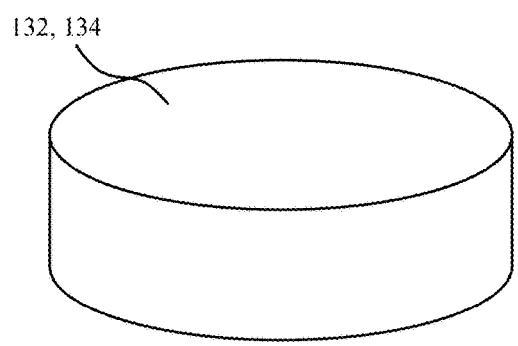
Figure 12C:
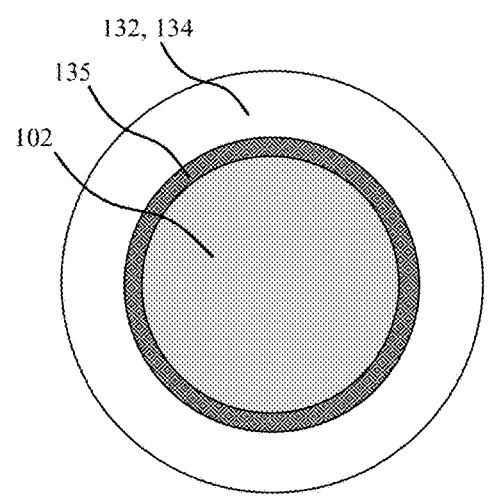
Figure 12D:
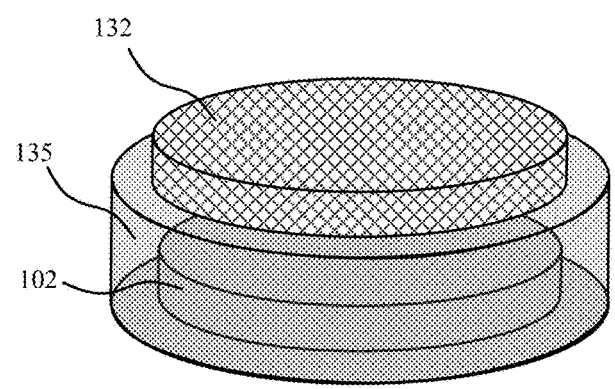

Referring now to FIGS. 12A-12D various exemplary configurations are illustrated in which an optional coupling agent 135 is utilized to couple one or more acoustic generators 132 or acoustic enclosure(s) 134 to a workpiece 102 in accordance with embodiments. In the embodiment illustrated in FIG. 12A a coupling agent 135 such as adhesive backing or gel for example, can be applied to the back side 107 and/or top surface 103 of the workpiece 102 and/or acoustic generator 132 or acoustic enclosure 134. The coupling agent 135 may assist in transferring acoustic waves between the acoustic generator 132 and workpiece 102, or between the workpiece 102 and acoustic enclosure 134. As shown in FIG. 12B, the workpiece 102 may be immersed or fully covered with a coupling agent 135, such as a gel. In the schematic top view illustration of FIG. 12C, the coupling agent 135 may be applied to an acoustic enclosure 134 or acoustic generator 132 that laterally surrounds the workpiece 102. FIG. 12D illustrates a workpiece 102 immersed within a coupling agent 135, and top acoustic generator 132 over the coupling agent 135 in accordance with an embodiment. In an embodiment, the configurations of FIGS. 12C-12D are combined, such as with the illustrations of FIGS. 2-3. In such a configuration the acoustic enclosure 134 may act as a reservoir to contain the coupling agent 135.

Figure 13:
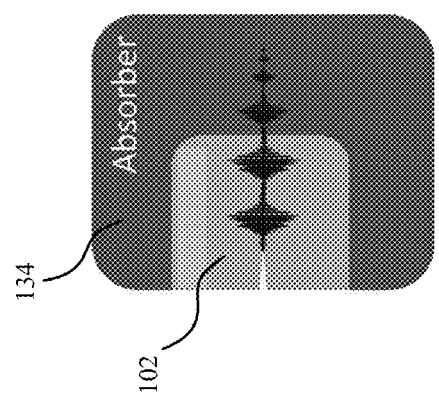
FIG. 13 is a schematic cross-sectional side view illustration of an acoustic enclosure that functions as an acoustic absorber in accordance with an embodiment.

Referring now to FIG. 13, in an embodiment the acoustic enclosure 134 functions as an acoustic absorber that absorbs waves emitted at the workpiece 102 boundary. For example, the acoustic enclosure can be formed of, or include, a material such as acoustic foam, vinyl sound barrier, damping compound, acoustic putty, etc.

Figure 14:
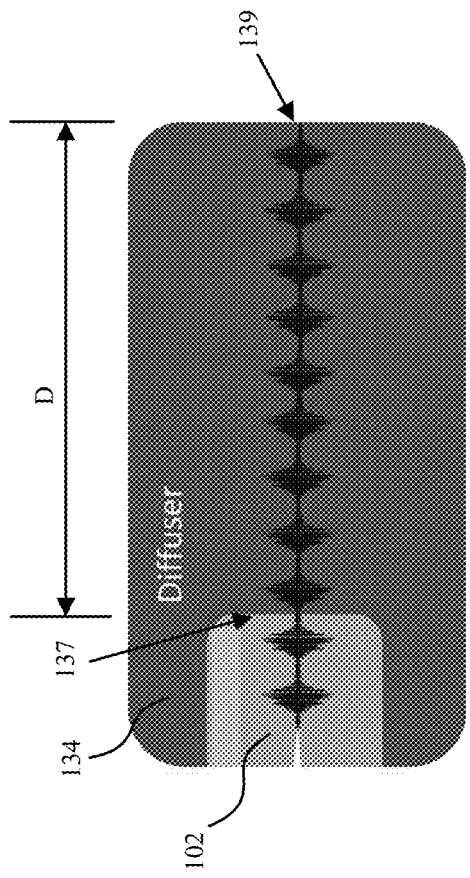
FIG. 14 is a schematic cross-sectional side view illustration of an acoustic enclosure that functions as a diffuser in accordance with an embodiment.

In the embodiment illustrated in FIG. 14, the acoustic enclosure 134 may be a diffuser material that transmits the emitted waves and hinders their reflection as the workpiece 102 boundaries. In such a configuration the crack may propagate through the entire workpiece 102 before the waves reflected at the outer surface 139 of the diffuser material reach the crack front. This may be facilitated by material selection of the diffuser material and depth (D) of the diffuser material between the inner surface 137 laterally adjacent the workpiece 102 and outer surface 139 in the direction of the crack propagation (e.g., laterally surrounding the workpiece 102). Such a diffuser material may have an acoustic impedance matching the workpiece in order to transmit rather than reflect the waves. The acoustic impedance of the materials can define transmission of acoustic waves from material to material. If the acoustic impedance of both materials match, the acoustic waves can fully propagate into the diffuser material. If the mismatch is large, most of the acoustic waves may be reflected. The acoustic impedance of the diffuser material may range from 0.0001 MRayl to 200 MRayl, or higher, in accordance with embodiments. The difference in acoustic impedance between the workpiece and the diffuser material may be 100 MRayls or less in some embodiments.

Figure 15:
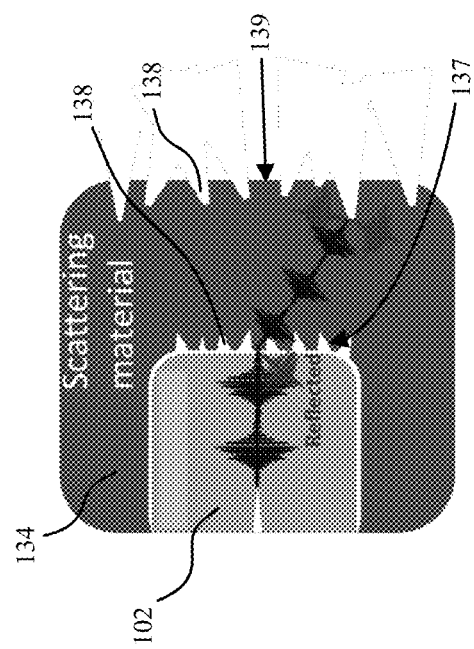
FIG. 15 is a schematic cross-sectional side view illustration of an acoustic enclosure that functions as a scattering material in accordance with an embodiment.

In an embodiment illustrated in FIG. 15 the acoustic enclosure 134 functions as a scattering material that can scatter the waves emitted by the crack front. As shown, in FIG. 15 the inner surface 137 and/or outer surface 139 of the acoustic enclosure can be roughened, include irregularities, or an irregular array of cavities 138 that can scatter the waves emitted by the crack front in an alternate direction. The features of the surface roughness (e.g., average surface roughness, Ra), irregularities, or irregular array of cavities can match the wavelength of the acoustic waves applied, which can range from 1 nm to 1 mm, or more specifically 10 nm to 500 μm. In operation these scattered waves may have low enough energy to not affect the crack front. The waves could also be absorbed during the scattering event before they can reach the crack front.

Figure 16:
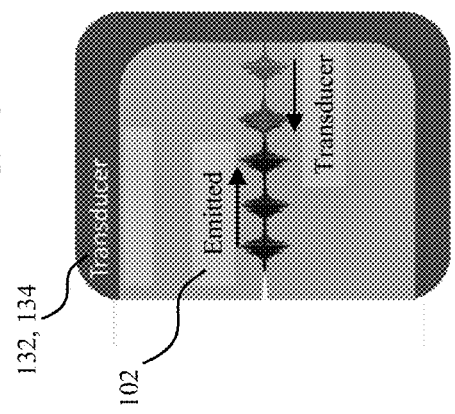
FIG. 16 is a schematic cross-sectional side view illustration of an acoustic enclosure and transducer that functions to provide destructive interference in accordance with an embodiment.

In an embodiment illustrated in FIG. 16, the acoustic enclosure 134 can be an acoustic generator 132 that emits characteristic waves that destructively interact with the waves emitted by the crack front (i.e., noise cancelation). The frequency, shape and amplitude of the applied acoustic waves could stay constant with time, or they could be modified as the crack front propagates.

As used herein, a "coupling" of at least two components may refer to electrically coupling a lead or connector of one electronics component with lead or connector of another electronics component. For example, two electronics components may be electrically coupled such that a current may flow from (or out of) one component to (or into) another component. In particular, two components may be electrically coupled such that components may (unilateral or bi-directional) communicate with each other by transmitting and/or receiving input analog signals and/or input digital signals. In one embodiment, components may be coupled such that they are directly connected with each other. In another aspect, components may be removably coupled together via one or more connectors. In which case, components may be removed and replaced as needed.

Figure 17:
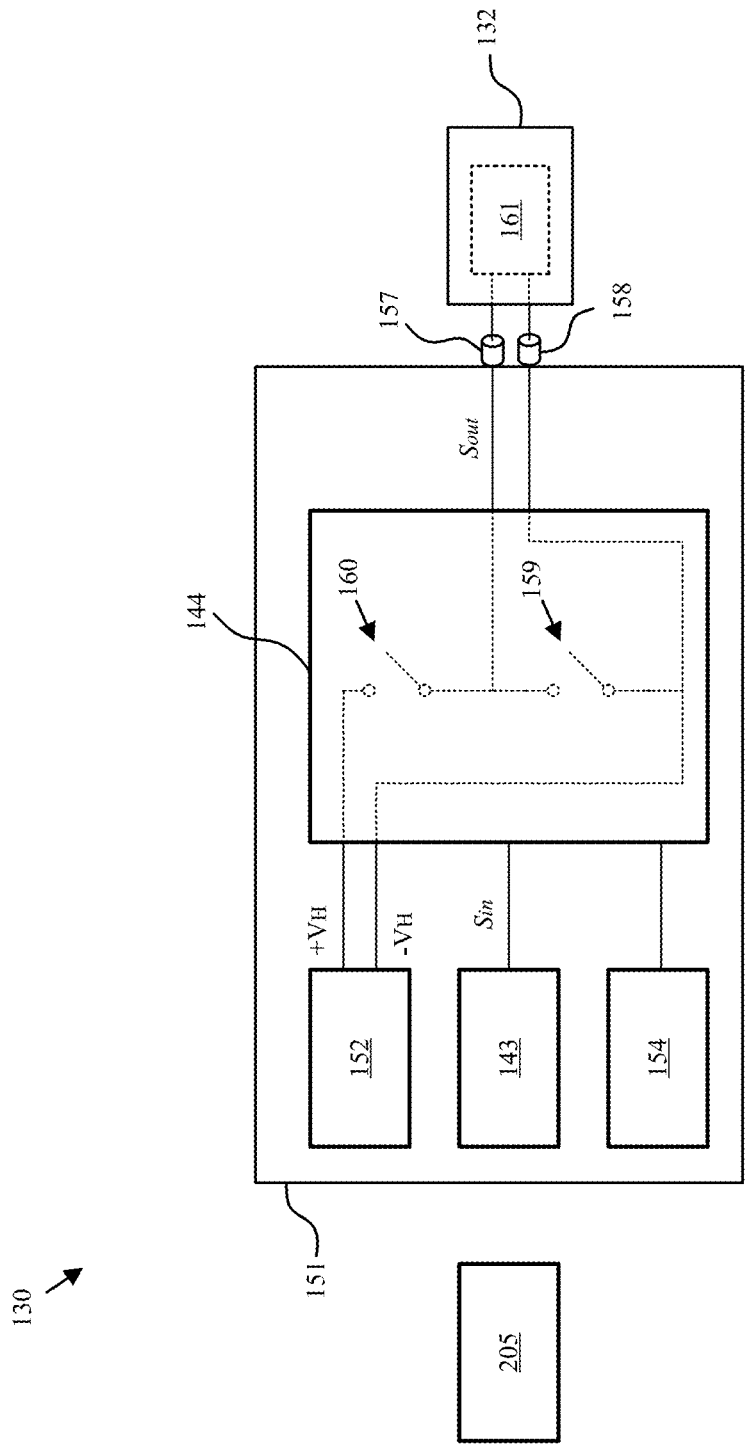
FIG. 17 is a block diagram of an acoustic system in accordance with an embodiment.

FIG. 17 is a block diagram of an acoustic system 130 in accordance with an embodiment. As described herein, may be configured to drive an acoustic generator with one or more piezoelectric devices (or materials) with an electrical output signal (as a series of high-voltage pulses) in order to acoustically cleave a workspace (or substrate). As shown, the acoustic system 130 includes an operating (or low-voltage) power supply 154, a signal generator 143, a high-voltage power supply 152, an acoustic cleaving circuit 144, and an acoustic generator 132, which may include a piezoelectric device (or material) 161. In one embodiment, the acoustic system 130 may include more or less elements. For example, the acoustic system may include multiple (or two or more) acoustic cleaving circuits 144, each acoustic cleaving circuit configured to drive (or control) one or more acoustic generators 132. In one embodiment, the multiple acoustic cleaving circuits may be configured to drive (e.g., an array of) one or more piezoelectric devices (of one or more acoustic generators). More about controlling multiple piezoelectric devices (and/or acoustic generators) is described herein.

The acoustic system 130 includes a housing 151 or enclosure that houses at least some of the elements of the system 130. As shown, the housing 151 includes the low-voltage supply 154, the signal generator 143, the high-voltage power supply 152, and the acoustic cleaving circuit 144. For instance, the housing may be formed of any material, such as a metal, an alloy, and/or a plastic in which the elements may be coupled (or connected). In one embodiment, the housing may include one or more openings or access points, which allow elements to be added and/or removed. In another aspect, the housing may not include at least some of the elements shown herein. For instance, the signal generator 143 may be a separate electronic device that may be coupled (e.g., via one or more connectors of the housing 151) to the acoustic cleaving circuit 144. For example, the housing includes two connectors 157 and 158, which may be arranged to couple the acoustic generator to the acoustic cleaving circuit 144 with leads. In one embodiment, the connectors may be any type of connector, which may allow connectors of the acoustic generator to be removably coupled to the housing 151. For example, the connectors 157 and 158 may be banana jacks, which connect to the acoustic generator via banana plugs (of the generator). In another aspect, the housing may include additional connectors, such as having one or more connectors that may be arranged to couple to the signal generator 143, which may be an external device, as described herein.

As described herein, the acoustic generator 132 may include one or more piezoelectric devices 161 that may be driven by the acoustic system 130 to oscillate (or actuate) at high frequencies (e.g., between 1 kHz to 100 MHZ) in order to acoustical cleave the workpieces. In particular, the piezoelectric device(s) may be arranged to actuate in one direction in response to a positive voltage cycle of an amplified output signal, $S_{out}$, produced by the acoustic cleaving circuit 144, and may be arranged to actuate in another (e.g., opposite) direction in response to a negative voltage cycle of $S_{out}$. More about driving the piezoelectric device(s) is described herein.

In one embodiment, the low-voltage power supply 154 may be arranged to provide power at a low voltage (below a voltage threshold) to operate one or more of the components of the system, such as the signal generator 143 and the acoustic cleaving circuit 144. For example, the low voltage power supply may be a 24-volt (V) direct current (DC) power supply. In another aspect, the low-voltage power supply may be arranged to provide power at other voltages, such as being a 12V supply. The high-voltage power supply 152 may be arranged to provide high voltage supply (e.g., above the voltage threshold) DC power to one or more components of the acoustic system 130. In particular, the supply 152 includes a positive voltage rail, $+V_H$, and a negative voltage rail, $-V_H$, for supplying driving power to the acoustic generator 132. For example, the high-voltage power supply may be arranged to provide a maximum voltage (e.g., per rail) between 0 V and 20 kV. In one embodiment, each rail may range between -20 kV to +20 kV. In another aspect, the high-voltage power supply may provide a maximum voltage between 3 kV and 20 kV. In some aspects, the maximum voltage may be greater than 20 kV. In one embodiment, the power supply may be arranged to provide power across for one or more voltages (e.g., across one or more voltage rails).

The signal generator 143 may be arranged to provide at least one input electrical signal, $S_{in}$, for driving the piezoelectric device(s) 161. In some embodiments, the signal generator may be arranged to provide one or more electrical signals. For example, the generator may be arranged to provide multiple input signals for driving multiple piezoelectric devices of the acoustic generator 132. More about driving multiple devices is described herein.

In one embodiment, $S_{in}$ may be any type of signal that may include a positive cycle and a negative cycle, such as a sinusoidal wave, a square wave, etc. In one embodiment, the input signal may have a frequency from 1 Hz to 100 MHz. In another aspect, the input signal may have a time period from 10 ns to 10 s. In another aspect, the input signal may include one or more electrical pulses that may be supplied at a particular frequency. In another aspect, the input signal may have a pulse width that varies between 10 ns and 10 s, while the time period between each pulse may range from 20 ns to 10 s. In another aspect, the acoustic cleaving circuit 144 may be arranged to condition $S_{in}$ to produce the series of pulses, which may be used to drive the acoustic generator. More about the acoustic cleaving circuit is described herein.

In one embodiment, $S_{in}$ provided by the signal generator 143 may be used to resonate the (piezoelectric device 161 of the) acoustic generator 132 at a driving frequency, which may be the same as the resonant frequency of the piezoelectric device, its frequency overtones, or other frequencies. In which case, $S_{in}$ may include (or have) a frequency at the resonant frequency of the piezoelectric device. More about how the input signal, $S_{in}$, drives the acoustic generator is described herein.

In one embodiment, the acoustic cleaving circuit 144 may be arranged to drive the (e.g., piezoelectric device 161 of the) acoustic generator 132 in response to receiving an input signal, $S_{in}$, from the signal generator 143. In particular, the acoustic cleaving circuit may include an amplifier that produces $S_{out}$ for driving the piezoelectric device based on a series of pulses received from (or based on $S_{in}$ received from) the signal generator. For example, the acoustic cleaving circuit may include two switches, a first (or bottom) switch 159 and a second (or top) switch 160 in a push-pull amplifier arrangement that may supply an amplified output signal, $S_{out}$, that may alternate the supply of current to the piezoelectric device 161 in order to actuate the device. For example, during a positive cycle of the $S_{in}$ the acoustic cleaving circuit may be in a first configuration in which the switch 160 is closed and switch 159 is open, thereby causing the acoustic cleaving circuit 144 to provide power from the high-voltage power supply 152 at or near $+V_H$ to the piezoelectric device 161. In which case, the piezoelectric device 161 may extend (or displace) along one direction. During a negative cycle of $S_{in}$, however, the acoustic cleaving circuit may be in a second configuration in which the switch 160 is open and switch 159 is closed, causing the acoustic cleaving circuit to supply current to the low-voltage power supply 152 at or near $-V_H$. In this case, the piezoelectric device 161 may retract along an opposite direction from its extended displacement (e.g., back to its original position). In one embodiment, these two configurations may be repeated at a high frequency in order to oscillate the piezoelectric device 161 back and forth. More about the acoustic cleaving circuit 144 is described herein.

The acoustic system 130 also includes a controller 205 that may be configured to perform one or more operations. The controller 205 may be a special-purpose processor such as an application-specific integrated circuit (ASIC), a general-purpose microprocessor, a field-programmable gate array (FPGA), a digital signal controller, or a set of hardware logic structures (e.g., filters, arithmetic logic units, and dedicated state machines). The controller is configured to perform operations to cause the system 130 to drive the piezoelectric device 161. More about the operations that may be performed by the controller are described herein.

The controller 205 may be configured to control the signal generator 143 by causing the generator to produce $S_{in}$. The controller may be communicatively coupled to least some elements of the system 130, such as the signal generator 143. In one embodiment, the controller may be a separate device from the signal generator and/or the housing 151, or may be a part of the housing and/or signal generator. In one embodiment, the controller may be configured to initiate operations of the system 130, such as initiating the driving of the switches 160 and 159 based on one or more conditions. For example, the controller may cause the signal generator to start driving the switches upon detecting that the power supply 152 has been activated (e.g., switched on). In one embodiment, operations performed by the controller may be implemented in software (e.g., as instructions stored in memory and executed by either controller) and/or may be implemented by hardware logic structures.

Figure 18:
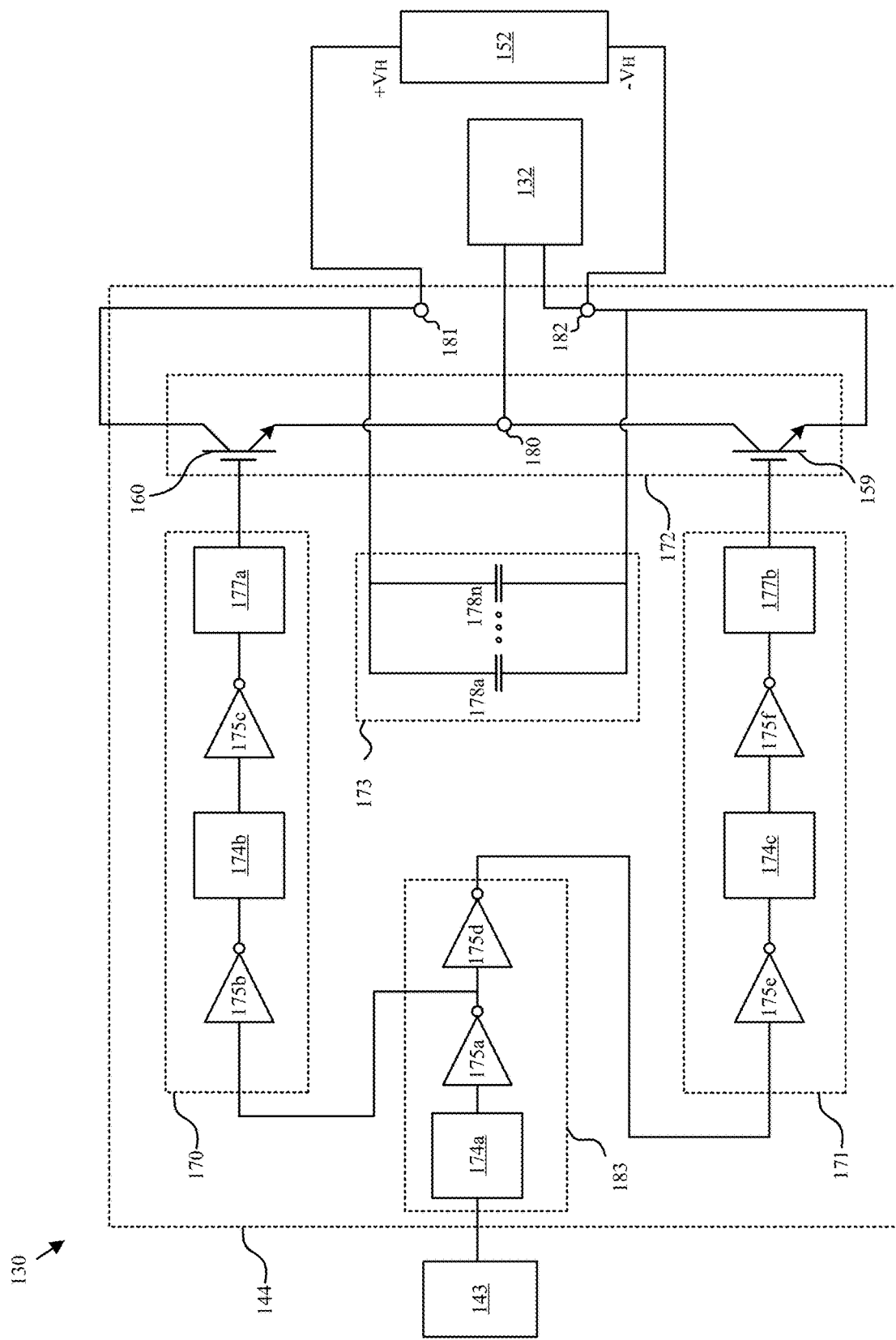
FIG. 18 is another block diagram of the acoustic system in accordance with an embodiment.

FIG. 18 is another block diagram of the acoustic system 130 in accordance with an embodiment. In particular, this figure shows an expanded view of the acoustic cleaving circuit 144. As shown, the circuit includes several electronic components, which may be housed, a part of, or disposed on the acoustic cleaving circuit 144. For instance, the acoustic cleaving circuit 144 may include one or more printed circuit boards (PCBs) on which one or more of the components of the circuit are mounted and/or may be communicatively coupled.

The acoustic cleaving circuit 144 includes several isolators 174a-174c, several inverters 175a-175f, several gate drivers 177a and 177b, one or more capacitors 178a-178n (as a capacitor bank 173), the pair of switches 159 and 160, and several terminals 180, 181, and 182. In one embodiment, the acoustic cleaving circuit 144 may include more or less components. For example, the acoustic cleaving circuit may include more inverters, or may include less isolators.

The acoustic cleaving circuit 144 may include several components that may be made up of one or more components described herein. For instance, the acoustic cleaving circuit 144 includes a first (or bottom) driving circuit 171 that includes a signal path for driving the switch 159, and a second (or top) driving circuit 170 that includes a signal path for driving the switch 160. The circuit 144 includes an input signal driving circuit 183 that includes one or more signal paths based on an input signal, e.g., $S_{in}$, received from the signal generator 143. The circuit 144 also includes a push-pull circuit 172 that includes both switches 159 and 160, and may be coupled to the high-voltage power supply 152 via terminal 181 (a positive voltage terminal) and terminal 182 (a negative voltage terminal). Although each circuit may be illustrated has having specific components of the circuit 144, one or more circuits may include components of one or more other circuits.

The isolators 174a-174c may be any type of isolator that may be designed to receive an electrical signal (or voltage) as input and pass through (or transfer) at least a portion of the signal as output. In particular, the isolators may be any type of (e.g., digital) isolator that may be arranged to electrically isolate one or more components of the acoustic system 130. As an example, the isolator 174a may be arranged to isolate the inverter 175a from the signal generator 143. In one embodiment, the isolators may be optoisolators that isolate two or more components within their signal paths using light transmission.

The inverters 175a-175f may be any type of inverter that may be arranged to receive an electrical signal and produce an inverted version of the electrical signal. For instance, when the input signal is a sine wave, the inverter may apply a 180° phase shift. In one embodiment, at least some of the inverters may be inverting Schmitt triggers that may be arranged to pass through an inverted version of an input signal as an output signal. In one embodiment, the Schmitt triggers may be designed to mitigate noise from high-voltage swings and mitigate transient currents caused by the push-pull circuit 172 from feeding back into the input signal.

The gate drivers 177a and 177b may be any type of gate drivers that are arranged to receive an input electrical signal, and based on the input signal produce an output driving signal (e.g., voltage) to drive one or more switches.

As described herein, the push-pull circuit 172 may include switch 159 and switch 160 in a push-pull arrangement. In particular, the switches may be any type of high-power switches that are designed to turn on and off, based on an input signal, at high frequencies to provide high power to a load, which in this case may be (one or more piezoelectric devices of) the acoustic generator 132. In one embodiment, each of the switches may be the same type of switch. For example, the switches 159 and 160 may be insulated-gate bipolar transistors (IGBTs). Specifically, both the IGBTs may be n-channel transistors, as shown. In another embodiment, the switches may be Gallium Nitride (GaN) field-effect transistors (FETs). In some embodiments, the switches may be any type of transistor.

A description of the acoustic cleaving circuit 144 and the signal path(s) of an input signal produced by the signal generator 143 will now be described. As shown, the signal generator 143 may be coupled to the input signal driving circuit 183, which may be arranged to produce one or more input signals based on an input signal, $S_{in}$, received from the signal generator 143 for driving the push-pull circuit. In particular, the circuit 183 includes the isolator 174a, which (e.g., has an input terminal that) may be coupled to the signal generator 143 and (e.g., has an output terminal that) may be coupled to inverter 175a, which may also be coupled to inverter 175b. The input signal driving circuit 183 may be coupled to both driving circuits 170 and 171 as follows to create at least two signal paths, one for each of the driving circuits. In particular, inverter 175a may be coupled to the driving circuit 170 and may be coupled to inverter 175d. In addition, inverter 175d may be coupled to driving circuit 171. Thus, the inverter 175a may be coupled between the signal generator 143 and the driving circuit 170, whereas both inverters 175a and 175d may be coupled between the signal generator 143 and the driving circuit 171. As a result, the driving circuit 170 may receive an inverted version of the $S_{in}$ received by the input signal driving circuit 183 from the signal generator 143, whereas the driving circuit 171 may receive a non-inverted version of $S_{in}$ (e.g., the original input signal). For example, the signal generator 143 may be configured to produce $S_{in}$, such as an analog or digital (DC) signal, or a digital (DC) signal, such as a square wave. The acoustic cleaving circuit 144 may be arranged to receive the input signal from (e.g., through a coupling with) the signal generator 143. In particular, the isolator 174a may receive $S_{in}$ and pass or transfer (at least a portion) of the input signal through to the inverter 175a, which may perform a 180° phase shift and provide the phase-shifted signal to the driving circuit 170 and to the inverter 175d. Inverter 175d may perform another 180° phase shift and provide the non-phase shifted input signal (e.g., the original input signal or a version of the original input signal received from the signal generator 143) to the driving circuit 171.

As shown, both of the driving circuits 170 and 171 may be coupled between the input signal driving circuit 183 and the push-pull circuit 172. In particular, the driving circuit 171 may be coupled to switch 159, and driving circuit 170 may be coupled to switch 160. Both of the driving circuits may have the same components (e.g., coupled in series) in a same arrangement, since both driving circuits are receiving input signals that are phase shifted with respect to each other. For example, the driving circuit 171 may include inverter 175e that may be coupled between inverter 175d and isolator 174c, which may be coupled to another inverter 175f that may be coupled to gate driver 177b. The driving circuit 170 may include inverter 175b that may be coupled between inverter 175a and isolator 174b, which may be coupled to inverter 175c that may be coupled to gate driver 177a.

In one embodiment, as a result of having the same arrangement, both driving circuits may drive their respective switches out of phase. For instance, driving circuit 170 may be configured to generate a driving signal that may be an inverted version of the input signal from the signal generator for driving switch 160, whereas driving circuit 171 may be configured to generate a driving signal that may be a non-inverted version of the input signal for driving switch 159.

The push-pull circuit 172 may be coupled to both driving circuits 170 and 171 and to the high-voltage power supply 152. In particular, a gate of the first switch 159 may be coupled to the driving circuit 171 and the emitter of the switch 159 may be coupled to the negative terminal 182 that may be coupled to the negative voltage rail, $-V_H$, of the high-voltage power supply 152 that may be arranged to provide negative voltage supply. Similarly, the gate of the second switch 160 may be coupled to the driving circuit 170 and the collector of the switch 160 may be coupled to the positive terminal 181 that may be coupled to the positive voltage rail, $+V_H$, of the high-voltage power supply 152 that may be arranged to provide positive voltage supply.

Each of the switches may be coupled together. In particular, the collector of the first switch 159 may be coupled to the emitter of the second switch 160 via an output terminal 180 of the push-pull circuit 172. In addition, the acoustic cleaving circuit 144 may be coupled to the acoustic generator 132 via at least some of the terminals. In particular, the acoustic generator 132 may be coupled to the output terminal 180 and the negative terminal 182. In addition, the capacitor bank 173 that may include one or more capacitors 178a-178n may be coupled in parallel to the push-pull circuit 172. In particular, the capacitor bank 173 may be coupled to the high-voltage power supply 152 via terminals 181 and 182. In one embodiment, the capacitors may be any type of capacitor (e.g., ceramic, film, etc.) that may be rated for high-voltages, such as rated up to 20 kV. In particular, the capacitors may be rated for the output voltage of the voltage supply 152, which may be applied across the push-pull circuit 172. In one embodiment, each of the capacitors may be the same type of capacitor. In another embodiment, each of the capacitors may have a capacitance within a range of 5 nF and 500 mF.

As described herein, the push-pull circuit may be an amplifying circuit that may be arranged to produce an amplified output signal, Sour. (at the output terminal 180) for driving the acoustic generator 132, in response to receiving one or more input signals from the driving circuits 170 and 171. For instance, as the driving circuits 170 and 171 receive input signals based on an input signal, $S_{in}$, provided by signal generator 143, which may have oscillating negative and positive cycles at high frequencies, the switches 159 and 160 may be driven to open and close in order to supply high power from the power supply 152 to the acoustic generator in a push-pull fashion, where the capacitor bank 173 may provide energy during operation of the amplifier in order to reduce voltage sag due to the piezoelectric material load.

Figure 19:
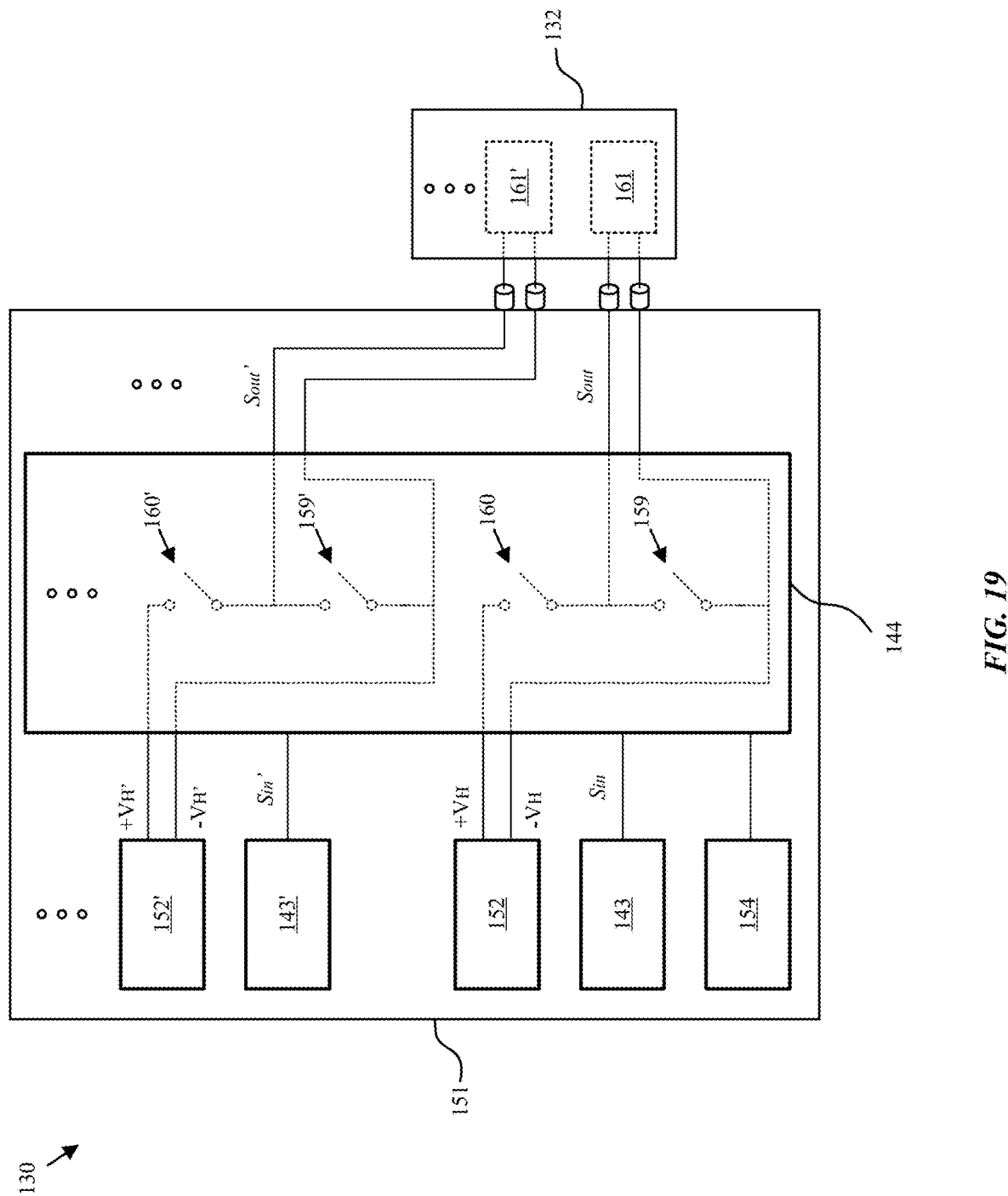
FIG. 19 is a block diagram of an acoustic system for driving multiple piezoelectric devices in accordance with an embodiment.
Figure 20:
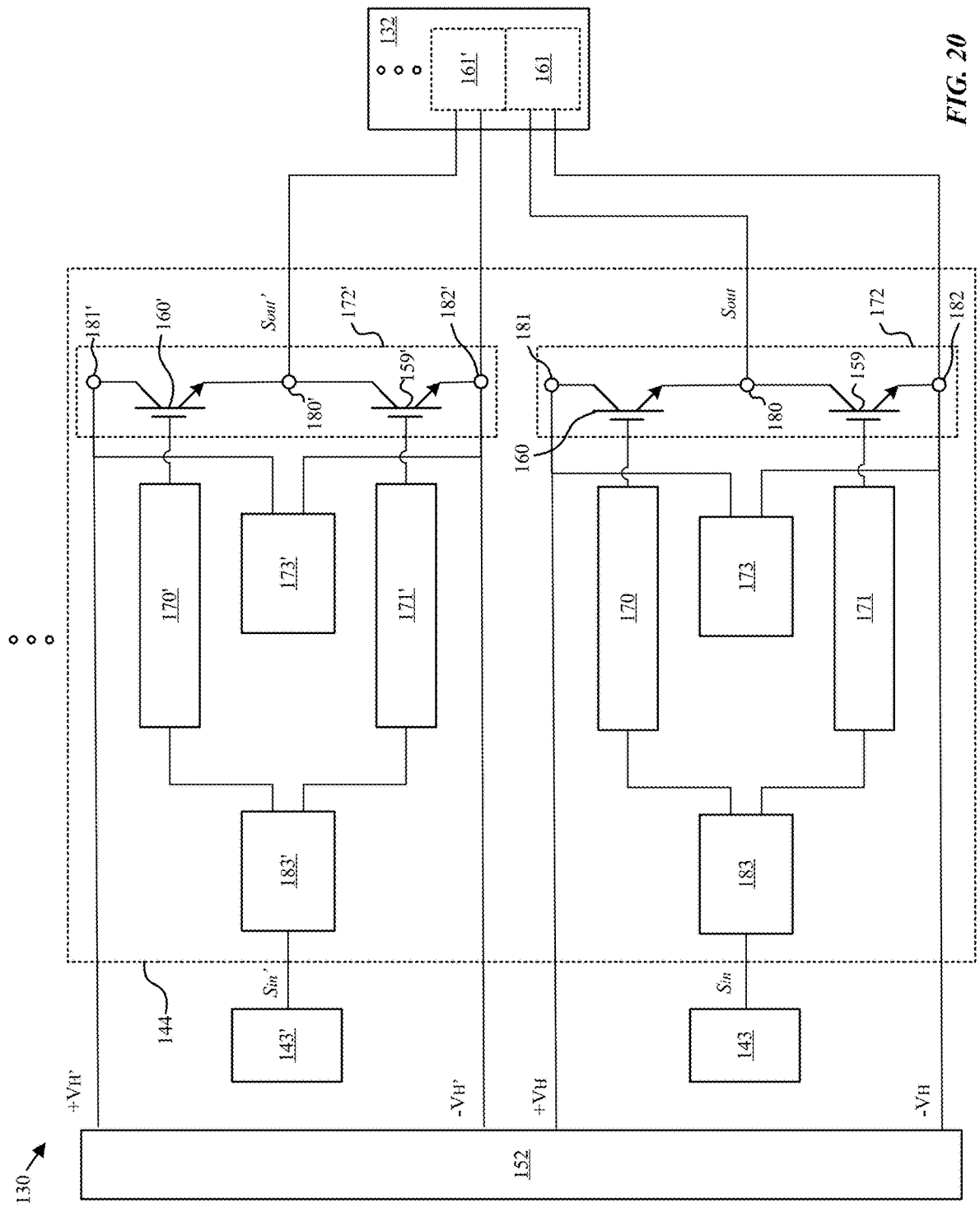
FIG. 20 is another block diagram of the acoustic system for driving multiple piezoelectric devices in accordance with an embodiment.
Figure 21:
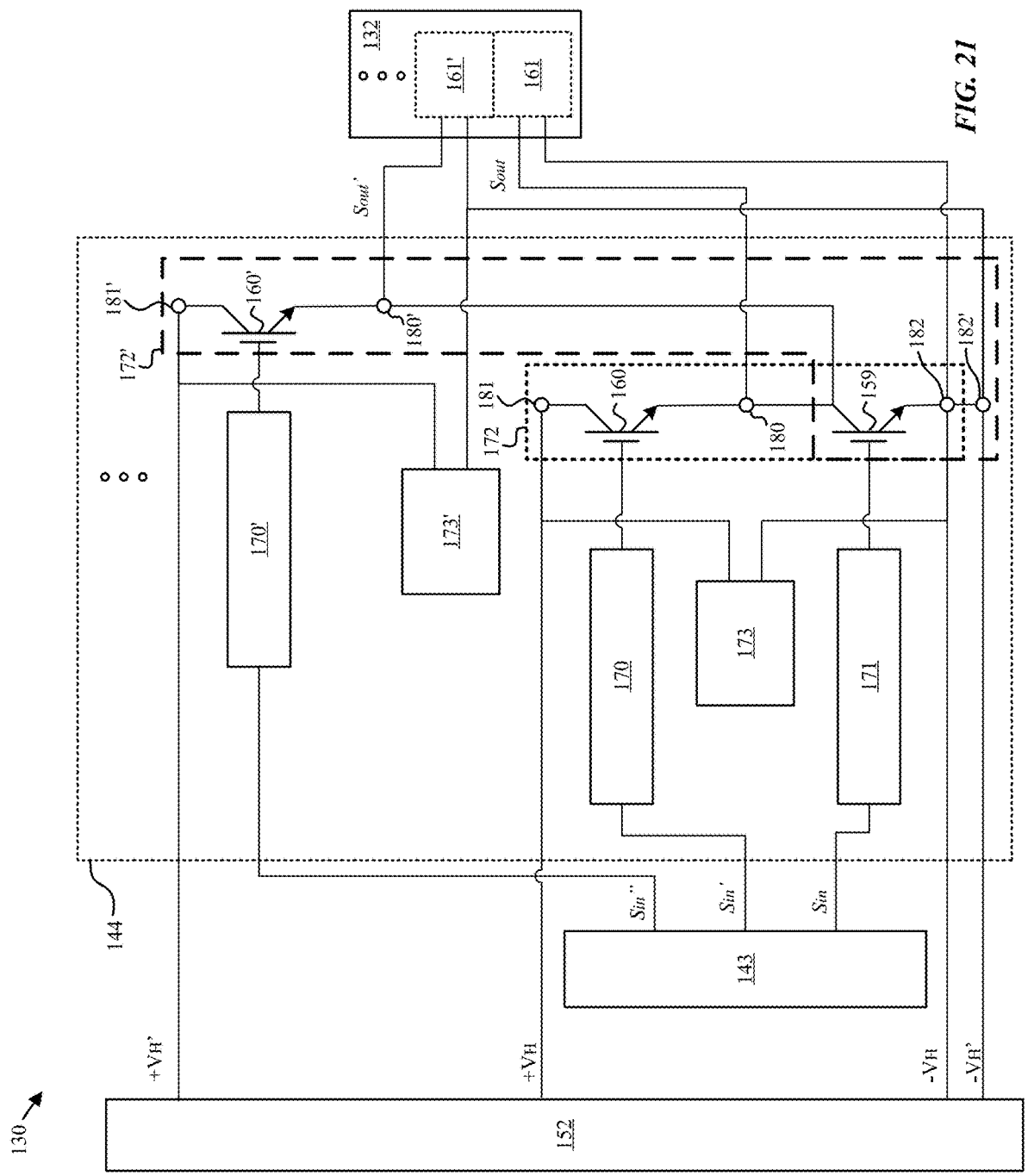
FIG. 21 is a block diagram of an acoustic system for driving several piezoelectric devices in accordance with an embodiment.

As described thus far, the acoustic system 130 may be configured to drive a piezoelectric device 161 of the acoustic generator 132, which may be used to create an indentation upon a workpiece in order to promote fracture of the piece. In another embodiment, the system 130 may be configured to drive multiple (e.g., similar, or different) piezoelectric devices to cleave a workpiece. In particular, the system may control multiple piezoelectric devices in order to create an indentation to promote a fracture, and to provide a controlled crack propagation along the workpiece. For example, the system 130 may control an array of one or more piezoelectric devices (e.g., at least partially in a sequential manner) to initiate and form (or propagate) a crack along a path of the workpiece. For instance, the array of piezoelectric devices may be controlled at least partially in a sequential manner to create a crack along a path that may coincide with an arrangement of the array of piezoelectric devices. FIGS. 19-21 provide examples of block diagrams of the acoustic system 130 that is capable of driving multiple piezoelectric devices.

Turning to FIG. 19, this figure shows a block diagram of the acoustic system 130 for driving multiple piezoelectric devices 161 and 161' of the acoustic generator 132 in accordance with an embodiment. As shown, the system 130 includes multiple signal generators 143 and 143' and multiple power supplies 152 and 152'. Each of the signal generators is producing one or more input signals, $S_{in}$ and $S_{in}'$, for driving one or more piezoelectric devices. For example, $S_{in}$ may be used to drive piezoelectric device 161, while $S_{in}'$ may be used to drive piezoelectric device 161', as shown. Each of the high-voltage power supplies may be arranged to supply one or more output voltages for driving one or more piezoelectric devices. In particular, each of the supplies may provide power at a same voltage, or may provide power at different voltages. For example, supply 152' provides power over rails $+V_H'$ and $-V_H'$, which may provide power at a different voltage than supply 152 that supplies $+V_H$ and $-V_H$. In one embodiment, the system 130 may drive one or more piezoelectric devices at differing voltages for various reasons. For example, differing voltages may result in differences in displacement of piezoelectric devices. As an example, one voltage may displace one piezoelectric device more than another voltage applied upon another piezoelectric device. In another embodiment, different piezoelectric devices may be rated different, such as some requiring one output voltage to be driven, while one or more other devices may require a different output voltage. In one embodiment, applying varying voltages may also allow for controlling the amount of stress introduced at a crack front and a crack velocity.

As shown, the power supplies 152 and 152' and the signal generators 143 and 143' may be separate (independent) electronic devices. In another embodiment, at least some of the devices may be a part of (or form) one electronic device. For example, although supplies 152 and 152' are shown as separate blocks, they may be a part of one power supply. In which case, a power supply of the system 130 may provide one or more output voltages, across multiple pairs of positive and negative rails. In another embodiment, the signal generators may be a part of one generator.

The cleaving circuit 144 may be arranged to drive two (or more) piezoelectric devices 161 and 161' with output signals, Sour and $S_{out}'$, respectively, responsive to the input signals $S_{in}$ and $S_{in}'$ from the signal generators. In particular, the cleaving circuit 144 includes several switches in several push-pull configurations. For example, along with switches 159 and 160, the cleaving circuit 144 includes switches 159' and 160' in a push-pull configuration for driving the device 161's with the output signal $S_{out}'$. In which case, each signal generator may be configured to drive switches in a push-pull configuration (e.g., push-pull circuit) to provide output voltage from the switches' respective high-voltage power supply to their respective piezoelectric device. Thus, this system 130 allows for performing a cleaving propagation based on how the devices 161 and 161' are controlled.

Thus, the system 130 allows for several piezoelectric devices to be driven, where the devices may be the same (e.g., rated the same) or may be different. In particular, as described herein, elements of the system 130 may be configured to drive different piezoelectric devices across different output voltages, which also allows for variation of how the devices are controlled. As a result, the system may provide better control of crack propagation.

FIG. 20 is another block diagram of the acoustic system 130 for driving multiple piezoelectric devices 161 and 161' in accordance with an embodiment. As shown, the system 130 includes at least some components shown in FIG. 18. For example, the system 130 includes high-voltage power supply 152, which includes the two pairs of positive and negative rails for supplying one or more output voltages into the cleaving circuit 144. The system 130 includes the two signal generators 143 and 143', the cleaving circuit 144, and the acoustic generator 132.

As shown, the cleaving circuit 144 includes at least some duplicated components illustrated in FIG. 18 for driving the piezoelectric devices 161 and 161'. In particular, the circuit 144 includes push-pull circuits 172 and 172', coupled to piezoelectric devices 161 and 161' respectively, where each push-pull circuit is for driving its respective piezoelectric device with power (output voltage) supplied by the power supply 152. In particular, the additional push-pull circuit 172' includes switches 159' and 160' in a push-pull configuration, where switch 159' is driven by driving circuit 171', and switch 160' is driven by driving circuit 170'. In one embodiment, the switches of the push-pull circuit 172' may be of a same type as the switches of circuit 172. In another embodiment, they may be different. For example, the pair of switches of either of the circuits may be based on the rating (e.g., power requirements) of the piezoelectric devices of which the switches are driving in their push-pull configuration. In addition, input signal driving circuit 183' may be arranged to receive signal $S_{in}'$ from the signal generator 143' and to split the signal into two signals (one in phase with $S_{in}'$ and another out-of-phase with $S_{in}'$) and providing the signals to the driving circuits 170' and 171'. In addition, circuit 172' includes several terminals, where a first terminal 182' may be coupled to the negative voltage rail-$V_H'$ and to the device 161', a second terminal 181' may be coupled to the positive voltage rail+$V_H'$, and terminal 180' may couple switches 159' and 160' to piezoelectric device 161' for providing the device with $S_{out}'$.

As shown, push-pull circuits 172 and 172' may be coupled (in parallel) to capacitor banks 173 and 173', respectively. In one embodiment, the capacitor banks may be rated the same. In another embodiment, they may be rated differently, based on the power output from the power supply 152 that may be drawn by a capacitor banks' respective push-pull circuit. In particular, the capacitor banks may be based on the output voltage across its terminals. For example, capacitor bank 173 (or capacitors of the bank) may have one capacitance, while the capacitor bank 173' may have a different capacitance, based on the output voltage of the power supply 152.

In one embodiment, the system 130 may drive the piezoelectric devices 161 and 161' in a similar or different manner. For example, both devices may be driven with similar (or the same) output signals (e.g., at a same driving frequency), such that both devices oscillate in a substantially similar manner and/or during similar (or same) time periods. In another embodiment, the piezoelectric devices may be driven differently. For example, both devices may be driven to oscillate differently (e.g., according to different driving frequencies of $S_{out}$ and $S_{out}'$, based on their respective input signals), according to different (or similar) power levels. In addition, both devices may be driven at different periods of time. In particular, the signal generators 143 and 143' may be arranged to independently drive the push-pull circuits 172 and 172', respectively, during at least partial overlapping or non-overlapping periods of time. For example, the signal generator 143 may drive device 161 for a first time period, while signal generator 143' may drive device 161' for a second time period that may not overlap the first time period.

As described herein, the system 130 may be arranged to drive multiple piezoelectric devices. In one embodiment, the system may be arranged to drive two or more devices, where each device may be driven using at least some duplicated components of FIG. 17. In particular, each piezoelectric device may be driven with a respective push-pull circuit having (e.g., dedicated) switches operating in a push-pull configuration. In another embodiment, at least some circuitry of the cleaving circuit may be arranged to drive multiple piezoelectric devices. For example, two or more push-pull circuits may share common circuitry (e.g., at least one switch) for driving multiple piezoelectric devices. Such a design may allow circuitry of the system 130 to be more compact, thereby reducing complexity and cost of the system. FIG. 21 illustrates an example of a block diagram of the acoustic system for driving several piezoelectric devices.

Turning to FIG. 21, this figure shows the acoustic system 130 configured to drive multiple piezoelectric devices 161 and 161' using common (shared) circuitry. In particular, this figure shows that the cleaving circuit 144 includes the push-pull circuit 172 that includes a pair of switches, switches 159 and 160, which may be coupled to the piezoelectric device 161, and may be arranged to drive the device with $S_{out}$. As described herein, the push-pull circuit 172 may couple to the piezoelectric device 161, via an output terminal 180. In addition, the circuit 172 may couple to the power supply 152 via terminals 181 and 182.

The cleaving circuit also includes another push-pull circuit 172' with a second pair of switches, 159 and 160', which may be coupled to the piezoelectric device 161, and may be arranged to drive the device with $S_{out}'$. Specifically, the push-pull circuit 172' includes an output terminal 180 coupled to both switches 160' and 159, and is coupled to the piezoelectric device 161'. The push-pull circuit 172' is also coupled to rails +$V_H'$ and -$V_H'$ via terminals 181' and 182'. As shown, the emitter of switch 159 may be coupled to both terminals 182 and 182'. As a result, both push-pull circuits share switch 159 as a common switch (e.g., coupled to both negative rails of the power supply 152). As described herein, the cleaving circuit 144 may be configured, based on input signals from the signal generator 143, to operate at least some of the switches in different push-pull configurations in order to drive one or more piezoelectric devices. More about the operation of the cleaving circuit 144 is described herein.

As shown, the cleaving circuit 144 includes at least some electronic components, as described herein. For example, the circuit 144 includes the first driving circuit 171 coupled between switch 159 and the signal generator 143, the second driving circuit 170 coupled between switch 160 and the signal generator 143. The circuit 144 also includes another driving circuit 170' that may be coupled between switch 160' and the signal generator 143. Both capacitor banks 173 and 173' may be coupled to terminals of their associated push-pull circuits. For example, capacitor bank 173 may be coupled to terminal 181 and 182, while capacitor bank 173' may be coupled to terminal 181' and 182'.

The signal generator 143 may be configured to control the push-pull circuits 172 and 172' to drive their respective piezoelectric devices. In one embodiment, the generator 143 may drive the piezoelectric devices during non-overlapping periods of time. For example, during a first period of time the signal generator 143 may supply input signals $S_{in}$ and $S_{in}'$ to driving circuits 171 and 170, respectively, in order to control switches 159 and 160 to draw power from the power supply 152 and drive the piezoelectric device 161 with Sour, in a push-pull fashion as described herein. In one embodiment, both input signals may be the same, or may be different. For example, $S_{in}'$ may be an out-of-phase version of $S_{in}$. In particular, both input signals may oscillate out of phase between positive and negative cycles at a given frequency.

During a second period of time, which may be subsequent (and/or a non-overlapping period of time) to the first period of time, the signal generator 143 may cease producing at least one of the input signals, such as $S_{in}'$, and begin to provide input signals $S_{in}$ and $S_{in}''$ to driving circuits 171 and 170'. In which case, switches 159 and 160' may operate in a push-pull configuration to draw power from (e.g., rails $+V_H'$ and $-V_H'$) and drive device 161' with Sour'. Thus, the signal generator 143 may generate pairs of input signals during different time periods to drive different pairs of switches in push-pull configurations. In one embodiment, $S_{in}$ may be an out-of-phase version of either (or both) $S_{in}'$ and $S_{in}''$. In another embodiment, each pair of input signals may be different or similar to each other. In which case, the signal generator may drive different piezoelectric devices at different driving frequencies based on the input frequency of the input signals.

In another embodiment, the signal generator 143 may be configured to drive one or more of the piezoelectric devices 161 and 161'' using this configuration during at least partial overlapping periods of time. In which case, the signal generator may produce input signals $S_{in}$, $S_{in}'$ and $S_{in}''$ such that the switches 159, 160, and 160' are driven at the same time (e.g., the switches receiving driving signals from their respective driving circuits at the same time). This may allow multiple (similar or different) piezoelectric devices to be controlled at any given time in order to propagate a crack, as described herein.

As a result, this design may allow for multiple pairs of switches, where each pair of switches may share a common switch, to be operated during overlapping or non-overlapping time periods in push-pull configurations.

In utilizing the various aspects of the embodiments, it would become apparent to one skilled in the art that combinations or variations of the above embodiments are possible for acoustic cleaving. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An acoustic cleaving apparatus comprising:
a crack initiator system to create an indentation on a workpiece;
a base stress system to induce a base stress on the workpiece;
an acoustic system to emit acoustic waves into the workpiece to maintain a controlled crack propagation through a material of the workpiece; and
a substrate holder to support the workpiece;
wherein the acoustic system includes:
an acoustic generator that includes an array of piezoelectric devices;
an electronic system that includes an acoustic cleaving circuit connected to the array of piezoelectric devices to apply acoustic energy at different locations across the workpiece and at different times; and
an acoustic enclosure including an annular opening to receive the workpiece, wherein the acoustic enclosure is to affect acoustic waves emitted by the controlled crack propagation through absorption, transmission, scattering, or acoustic emission.

2. The acoustic cleaving apparatus of claim 1, further comprising a robotic arm and wand to hold the workpiece.

3. The acoustic cleaving apparatus of claim 2, wherein the crack initiator system comprises a laser, wherein the laser and workpiece are positionable relative to one another so that the laser can be directed toward a top surface or a back side of the workpiece.

4. The acoustic cleaving apparatus of claim 2, wherein the robotic arm is coupled with a translation track.

5. The acoustic cleaving apparatus of claim 1, wherein the acoustic enclosure is an acoustic absorber formed of a material selected from the group consisting of acoustic foam, vinyl sound barrier, damping compound, and acoustic putty to absorb the acoustic waves emitted by the crack propagation during fracture.

6. The acoustic cleaving apparatus of claim 1, wherein the acoustic enclosure is diffuser formed of a material characterized by an acoustic impedance within 100 MRayl of an acoustic impedance of the workpiece in order to transmit rather than reflect the acoustic waves emitted by the crack propagation during fracture.

7. The acoustic cleaving apparatus of claim 1, wherein the acoustic enclosure includes an inner surface forming the annular opening and an outer surface, wherein the inner surface or the outer surface comprises a surface roughness, irregularities, or an irregular array of cavities characterized by an average surface roughness (Ra) of 1 nm to 1 mm to scatter the acoustic waves emitted by the crack propagation during fracture.

8. The acoustic cleaving apparatus of claim 1, wherein the acoustic enclosure includes a second acoustic generator to emit acoustic waves that destructively interact with acoustic waves emitted by the crack propagation during fracture.

9. The acoustic cleaving apparatus of claim 1, wherein the acoustic system comprises:
a high-voltage power supply comprising a positive voltage rail and a negative voltage rail; and
an acoustic cleaving circuit that includes:
a push-pull circuit coupled to the positive voltage rail and the negative voltage rail, the push-pull circuit comprising an output terminal that is coupled to at least one piezoelectric device of the array of piezoelectric devices, wherein the at least one piezoelectric device is coupled to the negative voltage rail, and a set of one or more capacitors coupled in parallel to the push-pull circuit, wherein the push-pull circuit is for receiving at least one input signal and for producing an amplified output signal at the output terminal to drive the piezoelectric device.

10. The acoustic cleaving apparatus of claim 9, wherein the acoustic cleaving circuit comprises:

a first terminal for coupling to the positive voltage rail of the high-voltage power supply; and a second terminal for coupling to the negative voltage rail of the high-voltage power supply and to the piezoelectric device of an acoustic generator, wherein the push-pull circuit that comprises a first switch coupled between the first terminal and the output terminal, and a second switch coupled between the second terminal and the output terminal, wherein the first and second switches are of a same type of switches;

wherein the set of one or more capacitors is coupled to the first and second terminals.

11. The acoustic cleaving apparatus of claim 1, wherein the acoustic system comprises:

a power supply;

a signal generator for producing an input signal comprising a frequency at a resonant frequency of at least one piezoelectric device of the array of piezoelectric devices; and an amplifier coupled to the power supply, the signal generator, and the at least one piezoelectric device, wherein the amplifier is for producing an output signal by amplifying the input signal using power supplied by the power supply to drive the at least one piezoelectric device.

12. The acoustic cleaving apparatus of claim 11, wherein the amplifier comprises a push-pull circuit, wherein the acoustic system further comprises a capacitor bank that includes one or more capacitors coupled in parallel to the push-pull circuit.

* * * * *